US012185580B2

(12) United States Patent
Choi et al.

(10) Patent No.: US 12,185,580 B2
(45) Date of Patent: Dec. 31, 2024

(54) DISPLAY APPARATUS WITH IMPROVED QUALITY OF AN IMAGE OUTPUT

(71) Applicant: Samsung Display Co., Ltd., Yongin-Si (KR)

(72) Inventors: Chungsock Choi, Yongin-si (KR); Joohee Jeon, Yongin-si (KR); Sunmi Kang, Yongin-si (KR); Gunhee Kim, Yongin-si (KR); Hyunho Kim, Yongin-si (KR); Sunyoung Jung, Yongin-si (KR); Sungjin Hong, Yongin-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 0 days.

(21) Appl. No.: 17/559,108

(22) Filed: Dec. 22, 2021

(65) Prior Publication Data

US 2022/0208870 A1 Jun. 30, 2022

(30) Foreign Application Priority Data

Dec. 24, 2020 (KR) .................. 10-2020-0183704

(51) Int. Cl.
*H10K 59/121* (2023.01)
*H10K 59/65* (2023.01)
(52) U.S. Cl.
CPC .......... *H10K 59/121* (2023.02); *H10K 59/65* (2023.02)
(58) Field of Classification Search
CPC ..................................................... H10K 59/65
See application file for complete search history.

(56) References Cited

U.S. PATENT DOCUMENTS

| 2020/0133040 A1 | 4/2020 | Bang et al. |
| 2020/0135148 A1 | 4/2020 | Bai et al. |
| 2021/0065625 A1 | 3/2021 | Wang et al. |

FOREIGN PATENT DOCUMENTS

| CN | 208386636 U | | 1/2019 | |
| CN | 110914891 A | | 3/2020 | |
| CN | 113140601 A | * | 7/2021 | ........... G09G 3/2003 |
| KR | 10-2020-0050059 A | | 5/2020 | |
| KR | 10-2020-0052246 A | | 5/2020 | |

OTHER PUBLICATIONS

Machine Translation of CN-113140601-A.*

* cited by examiner

*Primary Examiner* — Suberr L Chi
(74) *Attorney, Agent, or Firm* — Innovation Counsel LLP

(57) ABSTRACT

A display apparatus including a main display area, a component area, and a peripheral area includes: a main sub-pixel including a main display element on a substrate to correspond to the main display area, an auxiliary sub-pixel including an auxiliary display element on the substrate to correspond to the component area, wherein the main display area and the component area have a first boundary portion, a second boundary portion, and a third boundary portion as boundary portions where at least three edges of each of the main display area and the component area are in contact with each other, and a main sub-pixel arranged at an innermost portion of the main display area and an auxiliary sub-pixel arranged at an outermost portion of the component area have a mutually identical arrangement to correspond to each of the first boundary portion, the second boundary portion, and the third boundary portion.

23 Claims, 21 Drawing Sheets

DISPLAY APPARATUS WITH IMPROVED QUALITY OF AN IMAGE OUTPUT

CROSS-REFERENCE TO RELATED APPLICATIONS

This application is based on and claims priority under 35 U.S.C. § 119 to Korean Patent Application No. 10-2020-0183704, filed on Dec. 24, 2020, in the Korean Intellectual Property Office, the disclosure of which is incorporated by reference herein in its entirety.

BACKGROUND

1. Field

One or more embodiments generally relate to a display apparatus, and more particularly, to a display apparatus that provides a high-quality image with improved quality of an image output through a component.

2. Description of the Related Art

In general, a display apparatus includes a display element and electronic elements for controlling an electric signal transmitted to the display element. Electronic elements include a thin-film transistor (TFT), a storage capacitor, and a plurality of lines.

Recently, usage of display apparatuses has diversified. In addition, as display apparatuses have become thinner and lighter, a range of use thereof has steadily expanded. As a use range of display apparatuses has diversified, various methods have been studied to design shapes of display apparatuses.

SUMMARY

However, in a display panel and a display apparatus including the display panel according to the related art, there is a drawback in that, during a design process for displaying a high-quality image, the image quality is deteriorated during camera shooting.

One or more embodiments provide a display apparatus that provides a high-quality image with improved quality of an image output through a component. However, this objective is only an example and do not limit the scope of the present disclosure.

Additional aspects of the present disclosure will be set forth in part in the description that follows and, in part, will be apparent from the description, or may be learned by practice of the embodiments of the present disclosure described herein.

According to an embodiment, a display apparatus including a main display area, a component area, and a peripheral area includes a substrate, a main sub-pixel including a main display element on the substrate to correspond to the main display area, an auxiliary sub-pixel including an auxiliary display element on the substrate to correspond to the component area, wherein the main display area and the component area have boundary portions where at least three edges of each of the main display area and the component area are in contact with each other, and the boundary portions have a first boundary portion, a second boundary portion, and a third boundary portion, and a main sub-pixel arranged at an innermost portion of the main display area have a mutually identical arrangement to correspond to each of the first boundary portion, the second boundary portion, and the third boundary portion and an auxiliary sub-pixel arranged at an outermost portion of the component area have a mutually identical arrangement to correspond to each of the first boundary portion, the second boundary portion, and the third boundary portion.

The first boundary portion and the third boundary portion may be arranged in a first direction, and the second boundary portion may be arranged in a second direction crossing the first direction.

The first boundary portion, the second boundary portion, and the third boundary portion may be sequentially connected.

At least one edge of the component area may be in contact with the peripheral area.

The auxiliary sub-pixel may include a first-color auxiliary sub-pixel, a second-color auxiliary sub-pixel, and a third-color auxiliary sub-pixel, and the first-color auxiliary sub-pixel, the second-color auxiliary sub-pixel, and the third-color auxiliary sub-pixel may be arranged in a diagonal direction.

A green main sub-pixel may be arranged on an innermost line of the main display area that surrounds the component area to correspond to the boundary portions.

A red auxiliary sub-pixel or a blue auxiliary sub-pixel may be arranged on a first line located at the outermost portion of the component area corresponding to the boundary portions.

A green auxiliary sub-pixel may be arranged on a second line neighboring the first line of the component area.

A red main sub-pixel and a blue main sub-pixel may be alternately arranged on an innermost line of the main display area that surrounds the component area corresponding to the boundary portions.

A green auxiliary display element may be arranged on a first line located at the outermost portion of the component area corresponding to the boundary portions.

The auxiliary sub-pixel may include a first-color auxiliary sub-pixel, a second-color auxiliary sub-pixel, and a third-color auxiliary sub-pixel, and the first-color auxiliary sub-pixel and the second-color auxiliary sub-pixel, or the first-color auxiliary sub-pixel and the third-color auxiliary sub-pixel may be alternately arranged in a same column or row.

A green main sub-pixel may be arranged at an innermost line of the main display area corresponding to the boundary portions.

A red auxiliary sub-pixel and a green auxiliary sub-pixel may be alternately arranged on a first line located at the outermost portion of the component area corresponding to the boundary portions.

A blue auxiliary sub-pixel and a green auxiliary sub-pixel may be alternately arranged on a first line located at the outermost portion of the component area corresponding to the boundary portions.

A red main sub-pixel and a blue main sub-pixel may be alternately arranged on the innermost line of the main display area corresponding to the boundary portions.

A red auxiliary sub-pixel and a green auxiliary sub-pixel may be alternately arranged at an outermost line of the component area corresponding to the boundary portions.

A blue auxiliary sub-pixel and a green auxiliary sub-pixel may be alternately arranged at an outermost line of the component area corresponding to the boundary portions.

A red main sub-pixel and a blue main sub-pixel may be alternately arranged on an innermost line of the main display area corresponding to the boundary portions, a green auxiliary display element may be arranged on a first line located at the outermost portion of the component area corresponding to the boundary portions, and a red auxiliary sub-pixel and a blue auxiliary sub-pixel may be alternately arranged on a second line neighboring the first line of the component area.

The boundary portions may further include a fourth boundary portion arranged in a diagonal direction with respect to the first boundary portion to the third boundary portion, and an arrangement of the main sub-pixel and the auxiliary sub-pixel arranged to correspond to the first boundary portion to the third boundary portion may be different from an arrangement of the main sub-pixel and the auxiliary sub-pixel arranged to correspond to the fourth boundary portion.

A plurality of auxiliary sub-pixels may be provided in the component area and are spaced apart from each other, and the component area may include a transmission area between the auxiliary sub-pixels.

The display apparatus may further include a main pixel circuit arranged on the substrate to correspond to the main display area, and connected to the main sub-pixel, and an auxiliary pixel circuit arranged on the substrate to correspond to the peripheral area, and connected to the auxiliary sub-pixel.

The display apparatus may further include a component arranged under the substrate to correspond to the component area.

The component may include a camera.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of embodiments of the present disclosure will be more apparent from the following description taken in conjunction with the accompanying drawings, in which.

DETAILED DESCRIPTION

Figure 1:
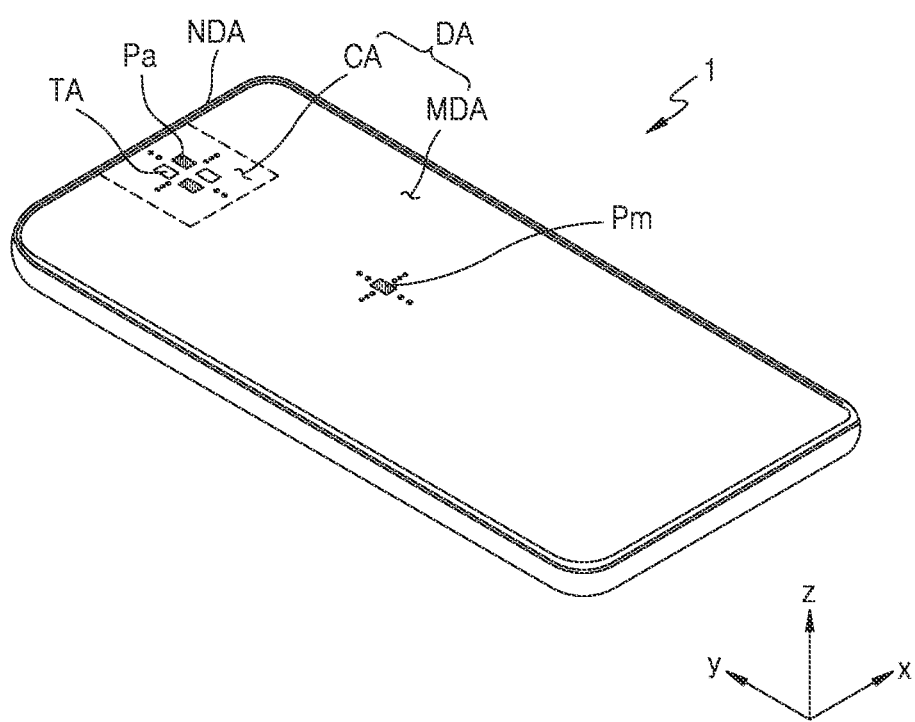
FIG. 1 is a perspective view schematically illustrating a display apparatus according to an embodiment.

Reference will now be made in detail to embodiments, examples of which are illustrated in the accompanying drawings, wherein like reference numerals refer to like elements throughout the present disclosure. In this regard, the present embodiments may have different forms and configuration and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Because the present disclosure may have diverse modified embodiments, embodiments are illustrated in the drawings and are described with respect to the embodiments. An effect and a characteristic of the present disclosure, and a method of accomplishing them will be apparent by referring to embodiments described with reference to the drawings. The present disclosure may, however, be embodied in many different forms and configurations and should not be construed as limited to the embodiments set forth herein.

One or more embodiments of the present disclosure will be described below in more detail with reference to the accompanying drawings. Components that are the same or are in correspondence with each other are rendered the same reference numeral regardless of the figure number, and redundant explanations are omitted.

While such terms as "first," "second," etc., may be used to describe various components, such components are not to be limited to the above terms. The above terms are used only to distinguish one component from another component.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be further understood that when a layer, region, or element is referred to as being "formed on" another layer, area, or element, it can be directly or indirectly formed on the other layer, region, or element. That is, for example, one or more intervening layers, regions, or elements may be present therebetween.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

In the present disclosure, the term "and/or" includes any and all combinations of one or more of the associated listed items. For example, "A and/or B" may include "A," "B," or "A and B." In addition, the expression "at least one of A and B" represents the case of A, B, or A and B.

In the following examples, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

In the present disclosure, when an embodiment can be implemented differently, a specific process order may be performed differently from the described order. For example, two consecutively described processes may be performed substantially at the same time or performed in an order opposite to the described order.

Sizes of elements in the drawings may be exaggerated or contracted for convenience of explanation. In other words, because sizes and thicknesses of components in the drawings are arbitrarily illustrated for convenience of explanation, the following embodiments are not limited thereto.

FIG. 1 is a perspective view schematically illustrating a display apparatus 1 according to an embodiment.

Referring to FIG. 1, the display apparatus 1 includes a display area DA and a peripheral area NDA located outside the display area DA. The display area DA may include a component area CA and a main display area MDA at least partially surrounding the component area CA. The component area CA displays an auxiliary image, and the main display area MDA displays a main image, and accordingly, the component area CA and the main display area MDA may display an image individually or together. The peripheral area NDA is a type of non-display area in which no display elements are arranged. The display area DA may be entirely surrounded by the peripheral area NDA.

FIG. 1 shows that the main display area MDA surrounds at least part of one component area CA. In another embodiment, the display apparatus 1 may include two or more component areas CA, and shapes and sizes of the component areas CA may be different from each other. When the component area CA is viewed from a direction approximately perpendicular to an upper surface of the display apparatus 1, the component area CA may have various shapes, such as a circular shape, an oval shape, a polygonal shape such as a quadrilateral shape and the like, a star shape, a diamond shape, or the like.

In FIG. 1, the component area CA is arranged at an upper center of the main display area MDA that has an approximately quadrilateral shape when viewed from a direction approximately perpendicular to the upper surface of the display apparatus 1, but the component area CA may also be arranged at one side, for example, an upper right side or an upper left side, of the quadrilateral main display area MDA. For example, a circular component area CA may be located in the main display area MDA, or a rectangular bar-type component area CA may be located at one side of the main display area MDA.

The display apparatus 1 may provide an image using a plurality of main sub-pixels Pm arranged in the main display area MDA and a plurality of auxiliary sub-pixels Pa arranged in the component area CA.

As will be described later with reference to FIG. 5, a component 40 that is an electronic element may be arranged under a display panel in the component area CA to correspond to the component area CA.

The component 40 may be an electronic element that uses light or sound. For example, the electronic element may include a sensor that measures a distance, such as a proximity sensor, a sensor that recognizes a user's body part (e.g., a fingerprint, an iris, a face, etc.), a small lamp that outputs light, an image sensor (e.g., a camera) that captures an image, and the like. An element using light may use light of various wavelength bands, such as visible light, infrared light, ultraviolet light, and the like. An electronic element using sound may use ultrasound or sound of other frequency bands. In some embodiments, the component 40 may include sub-components such as a light emitter and a light receiver. The light emitter and the light receiver may have an integrated structure or a physically separated structure where a pair of the light emitter and the light receiver form one component 40. In order to minimize the restrictions on functions of the component 40, the component area CA may include a transmission area TA through which light and/or sound output to the outside from the component 40 or travelling toward the component 40 from the outside may transmit.

In a case of a display panel and a display apparatus including the display panel according to an embodiment, when light is transmitted through the component area CA, a light transmittance may be about 10% or greater, for example, about 40% or greater, about 25% greater, about 50% or greater, about 85% or greater, or about 90% or greater.

A plurality of auxiliary sub-pixels Pa may be arranged in the component area CA. The plurality of auxiliary sub-pixels Pa may emit light and provide an image. An image displayed in the component area CA is an auxiliary image, and may have a lower resolution than an image displayed in the main display area MDA. In other words, the component area CA includes the transmission area TA through which light and sound may transmit, and when sub-pixels are not arranged in the transmission area TA, the number of auxiliary sub-pixels Pa that may be arranged per unit area in the component area CA may be less than the number of main sub-pixels arranged per unit area in the main display area MDA.

In the following description, an organic light-emitting display is described as an example of the display apparatus 1 according to an embodiment, but the display apparatus 1 according to the present disclosure is not limited thereto. In another embodiment, the display apparatus 1 of the present disclosure may be a display apparatus such as an inorganic light-emitting display (or an inorganic electroluminescent (EL) display) or a quantum dot light-emitting display. For example, an emission layer of a display element of the display apparatus 1 may include an organic material, an inorganic material, quantum dots, an organic material with quantum dots, or an inorganic material with quantum dots.

Figure 2:
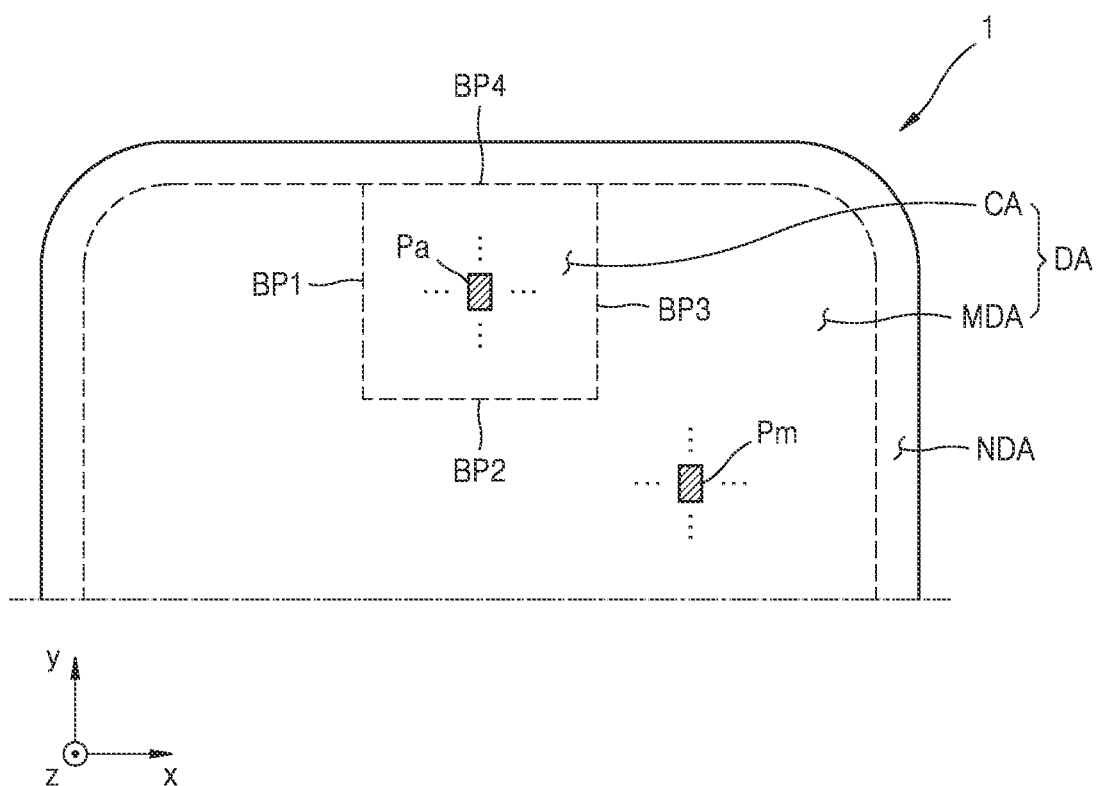
FIGS. 2, 3, and 4 are plan views illustrating various arrangements of a component area according to an embodiment.
Figure 3:
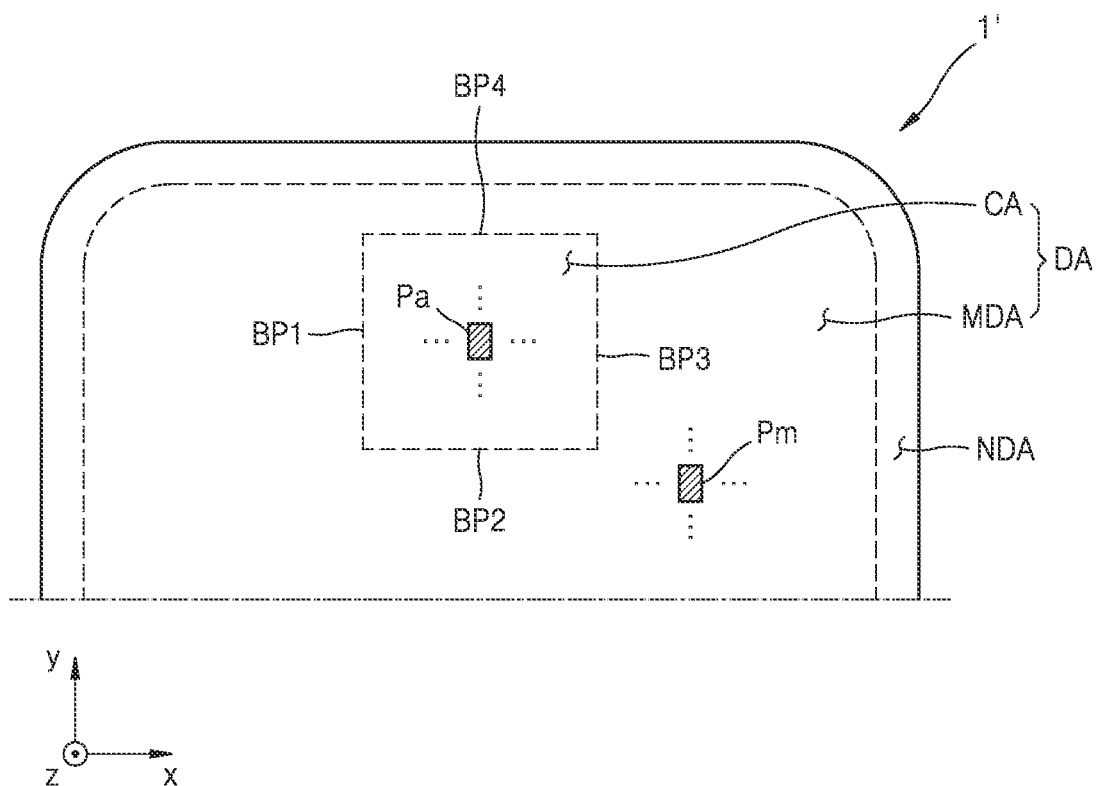
Figure 4:
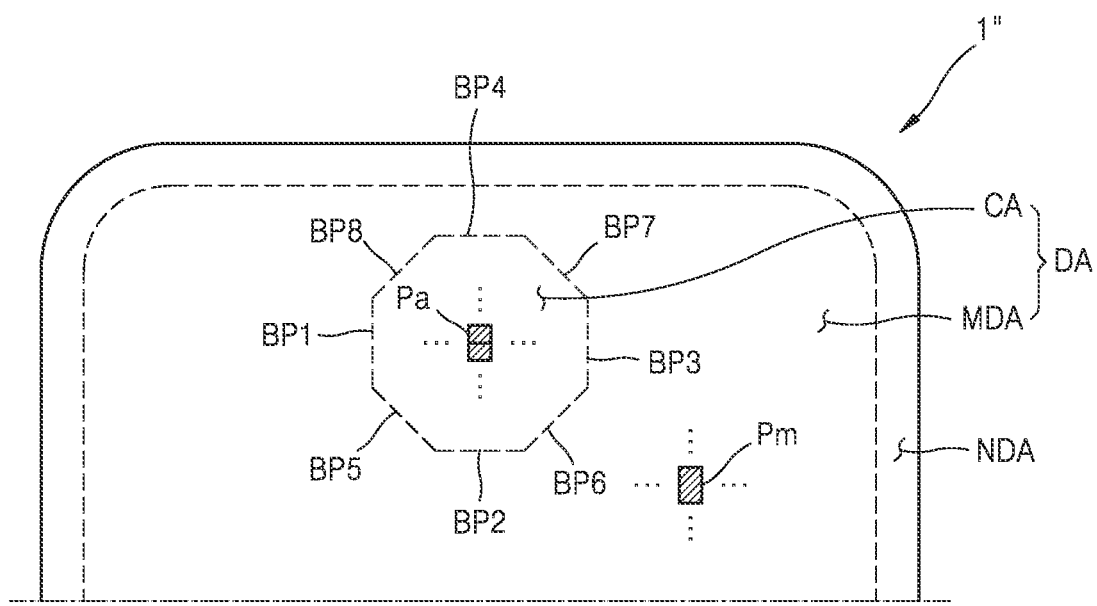
Figure 4:
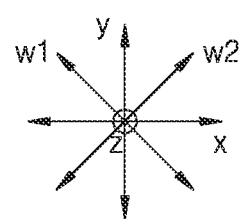

FIGS. 2, 3, and 4 are plan views illustrating various arrangements of a component area CA according to an embodiment.

Referring to FIG. 2, the component area CA is approximately quadrilateral, and at least one surface thereof directly contacts a peripheral area NDA. In the component area CA, the remaining three sides except the edge in contact with the peripheral area NDA may directly contact the main display area MDA. In the following description of the present disclosure, that "surfaces" of a first area and a second area that are distinguished from each other may mean that, in a plan view, "an edge" of a boundary portion where the first area and the second area meet is a contact point. In addition, "the boundary portion" where "the edge" is defined may mean a portion that extends in a same direction without bending.

The component area CA and the main display area MDA in FIG. 2 may contact each other at each of a first boundary portion BP1, a second boundary portion BP2, and a third boundary portion BP3. The component area CA and the peripheral area NDA may contact each other at a fourth boundary portion BP4.

Referring to FIG. 3, the component area CA has an approximately quadrilateral shape, and all surfaces thereof are in contact with the main display area MDA. Four surfaces of the component area CA may be in contact with the main display area MDA. In other words, the component area CA may be surrounded by the main display area MDA or may be located in the main display area MDA. The component area CA and the main display area MDA in FIG. 3 may contact each other at each of the first boundary portion BP1, the second boundary portion BP2, the third boundary portion BP3, and the fourth boundary portion BP4.

In FIGS. 2 and 3, the first boundary portion BP1 and the third boundary portion BP3 may extend in a first direction (e.g., y-direction) and be arranged in parallel with each other, and the second boundary portion BP2 and the fourth boundary portion BP4 may extend in a second direction (e.g., x-direction) and be arranged in parallel with each other. In this case, the first direction (e.g., y-direction) and the second direction (e.g., x-direction) may cross each other, that is, may be orthogonal to each other.

Referring to FIG. 4, the component area CA has an approximately octagonal shape, and all surfaces thereof are in contact with the main display area MDA. However, in another embodiment, similar to FIG. 2, at least one surface of the component area CA may contact the peripheral area NDA.

Eight surfaces of the component area CA may contact the main display area MDA. In other words, the component area CA may be surrounded by the main display area MDA or may be located in the main display area MDA. The component area CA and the main display area MDA in FIG. 4 may contact each other at each of the first, second, third, fourth, fifth, sixth, seventh, and eighth boundary portions BP1, BP2, BP3, BP4, BP5, BP6, BP7, and BP8.

In an embodiment, the first boundary portion BP1 and the third boundary portion BP3 may extend in the first direction (e.g., y-direction) and be arranged in parallel with each other, and the second boundary portion BP2 and the fourth boundary portion BP4 may extend in the second direction (e.g., x-direction) and be arranged in parallel with each other. In this case, the first boundary portion BP1 and the second boundary portion BP2 may cross each other, that is, may be orthogonal to each other. In addition, the fifth boundary portion BP5 and the seventh boundary portion BP7 may extend in a first diagonal direction (e.g., w1-direction) and be arranged in parallel with each other, and the sixth boundary portion BP6 and the eighth boundary portion BP8 may extend in a second diagonal direction (e.g., w2-direction) and be arranged in parallel with each other. In this case, the first diagonal direction (e.g., w1-direction) and the second diagonal direction (e.g., w2-direction) may cross each other, that is, may be orthogonal to each other.

Hereinafter, in the display apparatuses 1, 1', and 1" according to an embodiment, among boundary portions where the component area CA and the main display area MDA meet, boundary portions extending in a same direction or an orthogonal direction have a same pixel arrangement (i.e., a same display element arrangement). Through this, a difference in visibility between boundary portions of the component area CA and the main display area MDA in the display area DA may be minimized.

Figure 5:
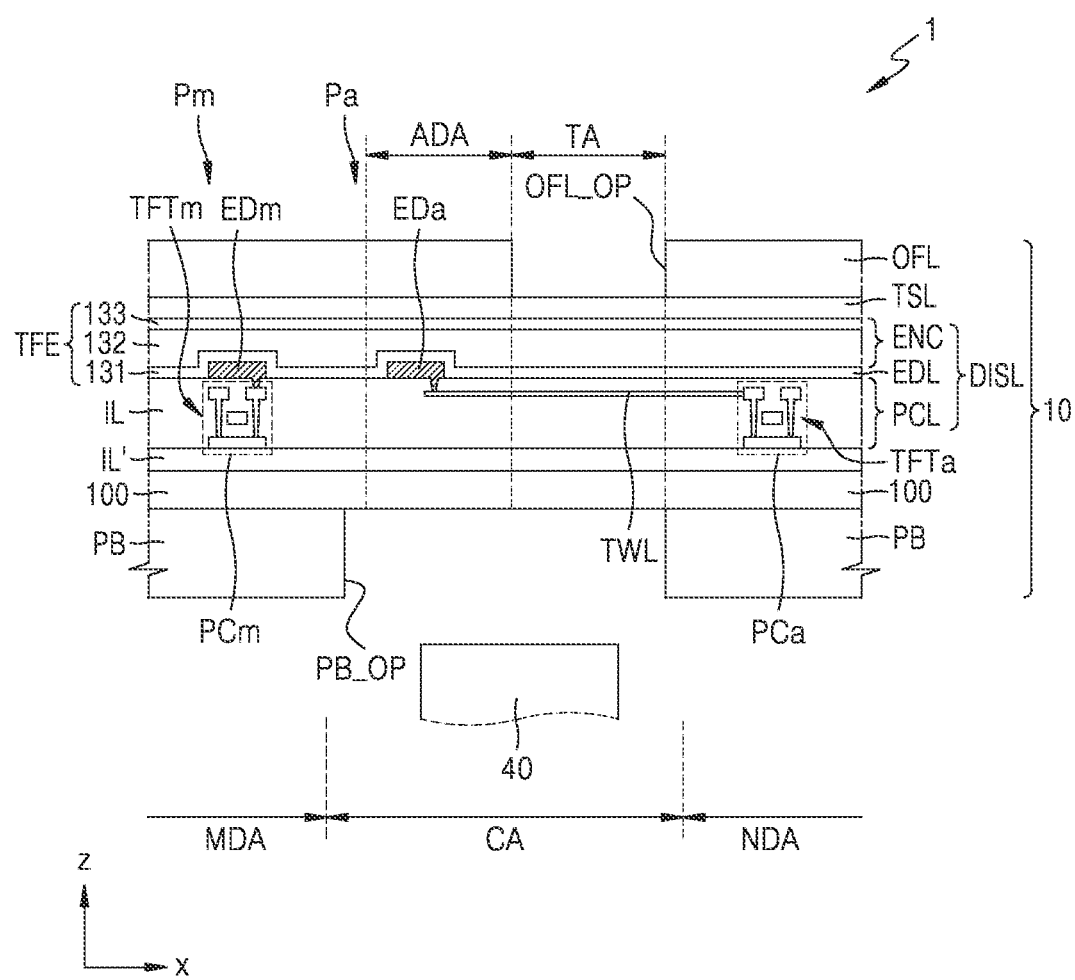
FIG. 5 is a cross-sectional view schematically illustrating part of a cross-section of a display apparatus according to an embodiment.

FIG. 5 is a cross-sectional view schematically illustrating part of a cross-section of a display apparatus 1 according to an embodiment.

Referring to FIG. 5, the display apparatus 1 may include a display panel 10 and a component 40 overlapping the display panel 10. A cover window (not shown) for protecting the display panel 10 may be further arranged above the display panel 10.

The display panel 10 may include a component area CA that is an area overlapping the component 40, and a main display area MDA where a main image is displayed. The display panel 10 may include a substrate 100, a display layer DISL above the substrate 100, a touch screen layer TSL, an optical functional layer OFL, and a panel protection member PB arranged below the substrate 100.

The display layer DISL may include a circuit layer PCL including a main thin-film transistor TFTm and an auxiliary thin-film transistor TFTa, a display element layer EDL including a main light-emitting element EDm and an auxiliary light-emitting element EDa as display elements, and an encapsulation layer ENC such as a thin-film encapsulation layer TFE or an encapsulation substrate (not shown). Insulating layers IL and IL' may be arranged in the display layer DISL and between the substrate 100 and the display layer DISL, respectively.

The substrate 100 may include an insulating material such as glass, quartz, a polymer resin, and the like. The substrate 100 may include a rigid substrate or a flexible substrate that is bendable, foldable, rollable, or the like.

The main light-emitting element EDm and a main pixel circuit PCm connected thereto may be arranged in the main display area MDA of the display panel 10. The main pixel circuit PCm includes at least one thin-film transistor, that is, the main thin-film transistor TFTm, and may control operations of the main light-emitting element EDm. A main sub-pixel Pm may be implemented by emission of the main light-emitting element EDm.

The auxiliary light-emitting element EDa is arranged in the component area CA of the display panel 10 so that an auxiliary sub-pixel Pa may be implemented. In the present embodiment, an auxiliary pixel circuit PCa for driving the auxiliary light-emitting element EDa is not arranged in the component area CA but may be arranged in a peripheral area NDA that is a non-display area. In another embodiment, the auxiliary pixel circuit PCa may be arranged in a portion of the main display area MDA or may be arranged between the main display area MDA and the component area CA, and various modifications may be made. In other words, the auxiliary pixel circuit PCa may not overlap the auxiliary light-emitting element EDa.

The auxiliary pixel circuit PCa includes at least one thin-film transistor, that is, the auxiliary thin-film transistor TFTa, and may be electrically connected to the auxiliary light-emitting element EDa through a connection line TWL. The connection line TWL may include a transparent conductive material. The auxiliary pixel circuit PCa may control operations of the auxiliary light-emitting element EDa. The auxiliary sub-pixel Pa may be implemented by emission of the auxiliary light-emitting element EDa.

An area of the component area CA in which the auxiliary light-emitting element EDa is arranged may be defined as an auxiliary display area ADA, and an area of the component area CA in which the auxiliary light-emitting element EDa is not arranged may be defined as a transmission area TA.

The transmission area TA may be an area through which light or a signal emitted from the component 40 or incident on the component 40 transmits, the component 40 being arranged to correspond to the component area CA. The auxiliary display area ADA and the transmission area TA may be alternately arranged in the component area CA. The connection line TWL connecting the auxiliary pixel circuit PCa and the auxiliary light-emitting element EDa to each other may be arranged in the transmission area TA. The connection line TWL may include a transparent conductive material having high transmittance, and thus, even if the connection line TWL is arranged in the transmission area TA, a transmittance of the transmission area TA may be secured. In the present embodiment, because the auxiliary pixel circuit PCa is not arranged in the component area CA, an area of the transmission area TA may be easily expanded, and the light transmittance thereof may be further improved.

The display element layer EDL may be covered with the thin-film encapsulation layer TFE as shown in FIG. 5, or may be covered with an encapsulation substrate. In an embodiment, the thin-film encapsulation layer TFE may include at least one inorganic encapsulation layer and at least one organic encapsulation layer as shown in FIG. 5. For example, the thin-film encapsulation layer TFE may include a first inorganic encapsulation layer 131, a second inorganic encapsulation layer 133, and an organic encapsulation layer 132 therebetween.

Each of the first inorganic encapsulation layer 131 and the second inorganic encapsulation layer 133 may include one or more inorganic insulating materials such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO), and may be formed by chemical vapor deposition (CVD) or the like. The organic encapsulation layer 132 may include a polymer-based material. Polymer-based materials may include silicone-based resins, acryl-based resins (e.g., polymethylmethacrylate, polyacrylic acid, etc.), epoxy-based resins, polyimide, polyethylene, and the like.

The first inorganic encapsulation layer 131, the organic encapsulation layer 132, and the second inorganic encapsulation layer 133 may be provided as a single body to cover the main display area MDA and the component area CA.

When the display element layer EDL is encapsulated by the encapsulation substrate, the encapsulation substrate may be arranged to face the substrate 100 with the display element layer EDL therebetween. The encapsulation substrate and the display element layer EDL may have a gap therebetween. The encapsulation substrate may include glass. A sealant including frit, etc. may be arranged between the substrate 100 and the encapsulation substrate, and the sealant may be arranged in the peripheral area NDA described above. The sealant arranged in the peripheral area NDA may surround the display area DA and prevent the penetration of water through a side surface of the display area DA.

The touch screen layer TSL may obtain coordinate information based on an external input, for example, a touch event. The touch screen layer TSL may include a touch electrode and touch lines connected to the touch electrode. The touch screen layer TSL may sense an external input based on a self-capacitance method or a mutual capacitance method.

The touch screen layer TSL may be formed on the thin-film encapsulation layer TFE. In some embodiments, the touch screen layer TSL may be separately formed on a touch substrate and then, may be coupled onto the thin-film encapsulation layer TFE through an adhesive layer such as an optical clear adhesive (OCA). In an embodiment, the touch screen layer TSL may be directly formed on the thin-film encapsulation layer TFE, and in this case, an adhesive layer may not be present between the touch screen layer TSL and the thin-film encapsulation layer TFE.

The optical functional layer OFL may include an anti-reflection layer. The anti-reflection layer may reduce a reflectance of light (external light) incident toward the display apparatus 1 from an outside.

In an embodiment, the optical functional layer OFL may be a polarizing film. An opening OFL_OP corresponding to the transmission area TA is defined in the optical functional layer OFL. Thus, the light transmittance of the transmission area TA may be significantly improved. The opening OFL_OP may be filled with a transparent material such as an optically clear resin (OCR). In another embodiment, the optical functional layer OFL may include a filter plate including a black matrix and color filters.

The panel protection member PB may be attached to a lower portion of the substrate 100 and support and protect the substrate 100. An opening PB_OP corresponding to the component area CA is defined in the panel protection member PB. When the opening PB_OP is defined in the panel protection member PB, the light transmittance of the component area CA may be improved. The panel protection member PB may include polyethylene terephthalate or polyimide.

An area of the component area CA may be greater than an area where the component 40 is arranged. Thus, an area of the opening PB_OP provided in the panel protection member PB may not correspond to the area of the component area CA. In FIG. 5, the component 40 is spaced apart from the display panel 10 at one side of the display panel 10 along the third direction (e.g., z-direction), but at least a portion of the component 40 may be inserted into the opening PB_OP provided in the panel protection member PB.

In addition, a plurality of components 40 may be arranged in the component area CA. The components 40 may have different functions from each other. For example, the components 40 may include at least two of a camera (an imaging device), a solar cell, a flash, a proximity sensor, an illuminance sensor, and an iris sensor.

Figure 6:
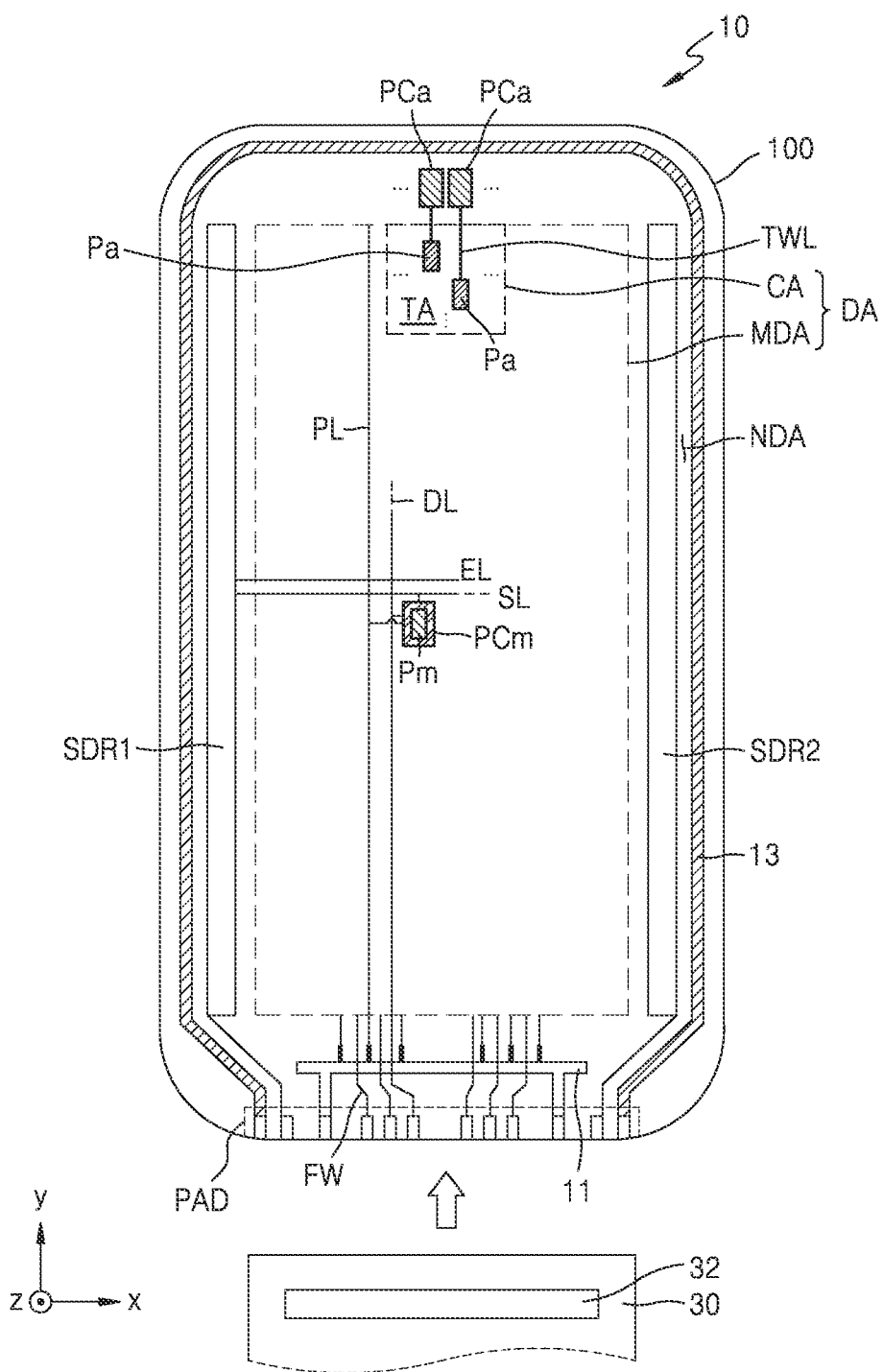
FIG. 6 is a plan view schematically illustrating a display panel that may be included in the display apparatus in FIG. 1, according to an embodiment.

FIG. 6 is a plan view schematically illustrating a display panel that may be included in the display apparatus 1 in FIG. 1, according to an embodiment.

Referring to FIG. 6, various elements included in a display panel 10 are arranged on a substrate 100.

A plurality of main sub-pixels Pm may be arranged in a main display area MDA. Each of the main sub-pixels Pm may be implemented as a light-emitting element by a display element such as an organic light-emitting diode (OLED). A main pixel circuit PCm configured to drive the main sub-pixels Pm may be arranged in the main display area MDA, and the main pixel circuit PCm may overlap the main sub-pixel Pm. Each of the main sub-pixels Pm may emit, for example, red, green, blue, or white light. The main display area MDA may be covered with an encapsulation member and protected from ambient air, moisture, or the like.

A component area CA may be located at one side of the main display area MDA as described above or may be arranged in a display area DA and surrounded by the main display area MDA. A plurality of auxiliary sub-pixels Pa may be arranged in the component area CA. Each of the plurality of auxiliary sub-pixels Pa may be implemented as a light-emitting element by a display element such as an organic light-emitting diode (OLED). For example, each of the plurality of auxiliary sub-pixels Pa may emit red, green, blue, or white light. The component area CA may be covered with the encapsulation member and protected from ambient air, moisture, or the like.

Meanwhile, an auxiliary pixel circuit PCa configured to drive the auxiliary sub-pixel Pa may be arranged in a peripheral area NDA adjacent to the component area CA. For example, as shown in FIG. 6, when the component area CA is arranged at an upper side of the display area DA, the auxiliary pixel circuit PCa may be arranged at an upper side of the peripheral area NDA. The auxiliary pixel circuit PCa and a display element implementing the auxiliary sub-pixel Pa may be connected to each other by a connection line TWL extending in one direction (e.g., y-direction).

Meanwhile, the component area CA may include a transmission area TA. The transmission area TA may surround the plurality of auxiliary sub-pixels Pa. In some embodiments, the transmission area TA may be arranged in a lattice shape with the plurality of auxiliary sub-pixels Pa.

Because the component area CA includes the transmission area TA, a resolution of the component area CA may be less than a resolution of the main display area MDA. For example, the resolution of the component area CA may be about ½, ⅜, ⅓, ¼, ⅖, ⅛, ⅑, 1/16, or the like of the resolution of the main display area MDA. For example, the resolution of the main display area MDA may be about 400 ppi or greater, and the resolution of the component area CA may be about 200 ppi or about 100 ppi.

The main pixel circuit PCm and the auxiliary pixel circuit PCa respectively configured to drive the main sub-pixels Pm and the auxiliary sub-pixels Pa may be respectively electrically connected to external circuits arranged in the peripheral area NDA. A first scan driving circuit SDR1, a second scan driving circuit SDR2, a terminal portion PAD, a driving voltage supply line 11, and a common voltage supply line 13 may be arranged in the peripheral area NDA.

The first scan driving circuit SDR1 may transmit, through a scan line SL, a scan signal to the main pixel circuit PCm configured to drive the main sub-pixel Pm. In addition, the first scan driving circuit SDR1 may transmit an emission control signal to each pixel circuit through an emission control line EL. The second scan driving circuit SDR2 may be arranged symmetrically with the first scan driving circuit SDR1 around the main display area MDA. Some main pixel circuits PCm of the main sub-pixel Pm of the main display area MDA may be electrically connected to the first scan driving circuit SDR1, and the other ones may be electrically connected to the second scan driving circuit SDR2.

The terminal portion PAD may be arranged at one side of the substrate 100. The terminal portion PAD may be exposed by not being covered with an insulating layer and may be connected to a display circuit board 30. A display driving portion 32 may be arranged on the display circuit board 30.

The display driving portion 32 may generate control signals to be transmitted to the first scan driving circuit SDR1 and the second scan driving circuit SDR2. The display driving portion 32 generates a data signal, and the generated data signal may be transmitted to the main pixel circuit PCm through a fan-out line FW and a main data line DLm (see FIG. 7B) connected to the fan-out line FW.

The display driving portion 32 may apply a driving voltage ELVDD (see FIGS. 7A and 7B) to the driving voltage supply line 11 and apply a common voltage ELVSS (see FIGS. 7A and 7B) to the common voltage supply line 13. The driving voltage ELVDD may be applied to the pixel circuits of the main and auxiliary sub-pixels Pm and Pa through a driving voltage line PL connected to the driving voltage supply line 11, and the common voltage ELVSS may be connected to the common voltage supply line 13 and applied to an opposite electrode of the display element.

The driving voltage supply line 11 may extend in the x-direction at a lower side of the main display area MDA. The common voltage supply line 13 has a loop shape with one side open and may partially surround the main display area MDA.

In FIG. 6, there is one component area CA, but the component area CA may be provided in plural. In this case, the plurality of component areas CA may be spaced apart from each other, and a first camera may be arranged to correspond to one component area CA, and a second camera may be arranged to correspond to another component area CA. In some embodiments, a camera may be arranged to correspond to one component area CA, and an infrared (IR) camera may be arranged to correspond to another component area CA. The plurality of component areas CA may have different shapes and different sizes from one another.

Figure 7A:
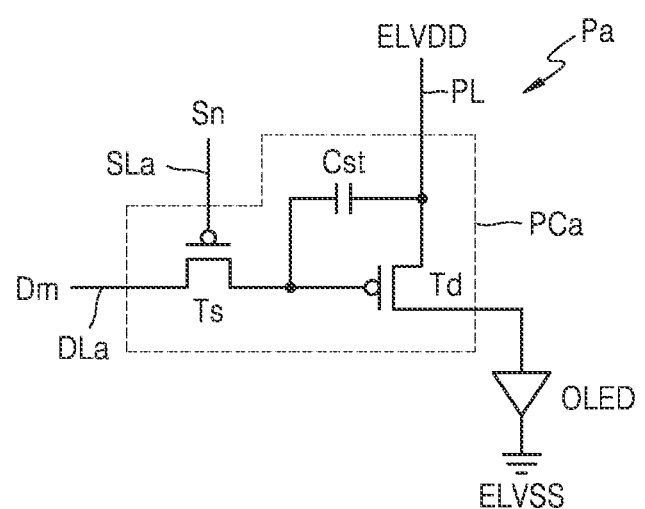
FIGS. 7A and 7B are equivalent circuit diagrams of a pixel that may be included in a display apparatus, according to an embodiment.
Figure 7B:
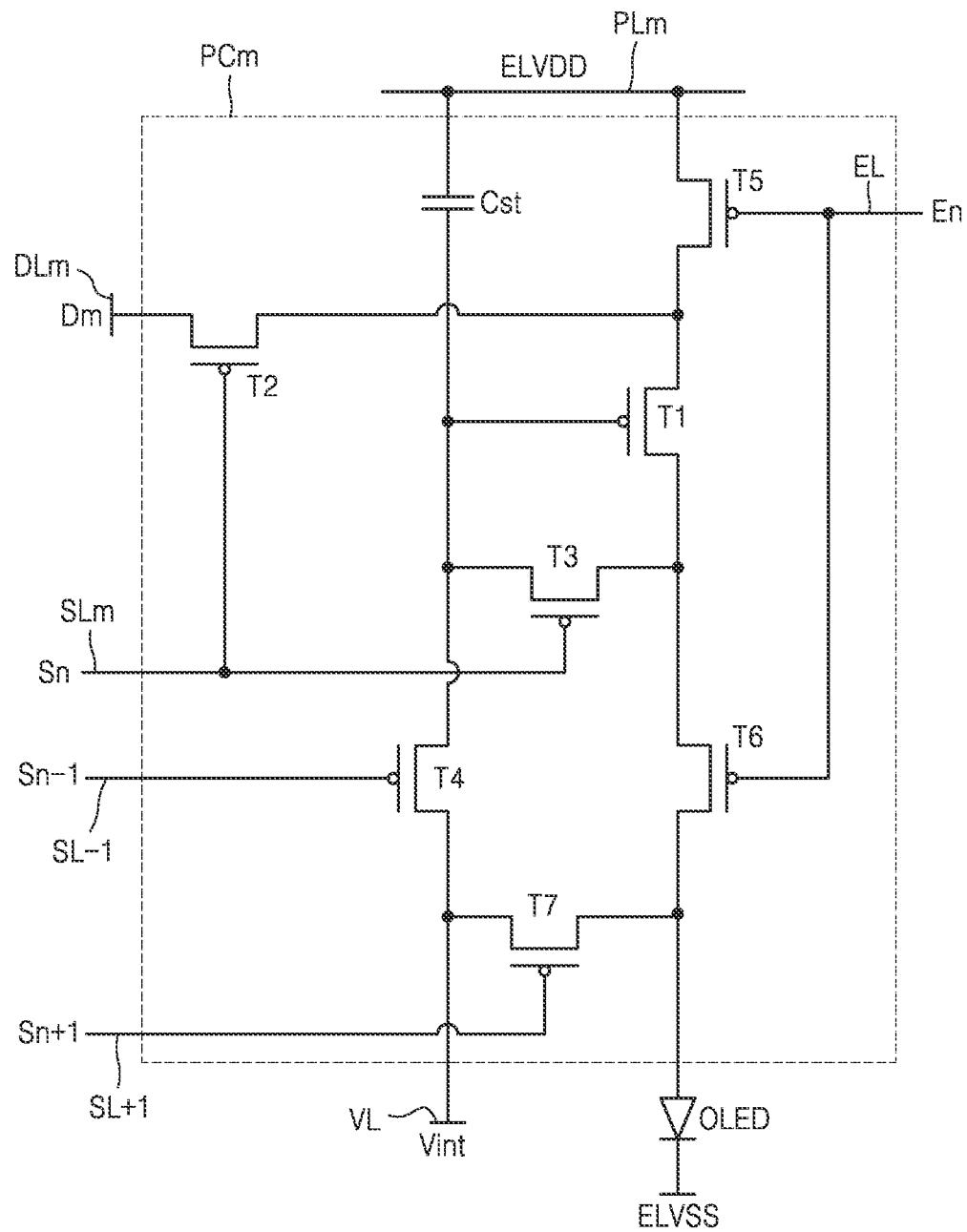

FIGS. 7A and 7B are equivalent circuit diagrams of a pixel that may be included in a display apparatus, according to an embodiment.

Referring to FIGS. 6, 7A and 7B, a main sub-pixel Pm includes a main pixel circuit PCm and an organic light-emitting diode OLED as a display element connected to the main pixel circuit PCm, and an auxiliary sub-pixel Pa includes an auxiliary pixel circuit PCa and an organic light-emitting diode OLED as a display element connected to the auxiliary pixel circuit PCa. In FIGS. 7A and 7B, the auxiliary sub-pixel Pa includes a pixel circuit of FIG. 7A, and the main sub-pixel Pm includes a pixel circuit of FIG. 7B. However, the present disclosure is not limited thereto. In another embodiment, the main sub-pixel Pm and the auxiliary sub-pixel Pa may include at least one of the main and auxiliary pixel circuits of FIGS. 7A and 7B. For example, both the main sub-pixel Pm and the auxiliary sub-pixel Pa may include the pixel circuit of FIG. 7B.

The auxiliary pixel circuit PCa of FIG. 7A includes a driving thin-film transistor Td, a switching thin-film transistor Ts, and a storage capacitor Cst. The switching thin-film transistor Ts is connected to an auxiliary scan line SLa and an auxiliary data line DLa and may transfer, according to a scan signal Sn received via the auxiliary scan line SLa, a data signal Dm received via the auxiliary data line DLa to the driving thin-film transistor Td.

The storage capacitor Cst is connected to the switching thin-film transistor Ts and an auxiliary driving voltage line PLa and may store a voltage corresponding to a voltage difference between a voltage received from the storage capacitor Cst and a driving voltage ELVDD applied to the auxiliary driving voltage line PLa.

The driving thin-film transistor Td is connected to the auxiliary driving voltage line PLa and the storage capacitor Cst and may control a driving current (la) flowing from the auxiliary driving voltage line PLa to the organic light-emitting diode OLED to correspond to the voltage stored in the storage capacitor Cst. The organic light-emitting diode OLED may emit light having a luminance according to the driving current (la).

In FIG. 7A, the auxiliary pixel circuit PCa includes two thin-film transistors and one storage capacitor, but the present disclosure is not limited thereto. In another embodiment, the auxiliary pixel circuit PCa may include seven thin-film transistors and one storage capacitor, which will be described later below. In another embodiment, the auxiliary pixel circuit PCa may include two or more storage capacitors.

Referring to FIG. 7B, the main pixel circuit PCm may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

In FIG. 7B, a main scan line SLm, a previous scan line SL−1, a next scan line, an emission control line EL, a main data line DLm, herein also collectively referred to as (main) signal lines, a (main) initialization voltage line VL, and a (main) driving voltage line PLm are provided for each main pixel circuit PCm, but the present disclosure is not limited thereto. In another embodiment, at least one of the (main) signal lines SLm, SL−1, SL+1, EL, and DLm and the (main) initialization voltage line VL may be shared with neighboring pixel circuits.

A drain electrode of the driving thin-film transistor T1 may be electrically connected to the organic light-emitting diode OLED through the emission control thin-film transistor T6. The driving thin-film transistor T1 may receive a data signal Dm according to a switching operation of the switching thin-film transistor T2 and supply a driving current to the organic light-emitting diode OLED.

A gate electrode of the switching thin-film transistor T2 is connected to the main scan line SLm, and a source electrode of the switching thin-film transistor T2 is connected to the main data line DLm. A drain electrode of the switching thin-film transistor T2 may be connected to a source electrode of the driving thin-film transistor T1 and a main driving voltage line PLm through the operation control thin-film transistor T5.

The switching thin-film transistor T2 may be turned on according to a scan signal Sn received via the main scan line SLm and perform a switching operation of transmitting the data signal Dm received via the main data line DLm to the source electrode of the driving thin-film transistor T1.

A gate electrode of the compensation thin-film transistor T3 may be connected to the main scan line SLm. A source electrode of the compensation thin-film transistor T3 may be connected to the drain electrode of the driving thin-film transistor T1 and may be connected to a pixel electrode of the organic light-emitting diode OLED through the emission control thin-film transistor T6. A drain electrode of the compensation thin-film transistor T3 may be connected to any one electrode of the storage capacitor Cst, a source electrode of the first initialization thin-film transistor T4, and a gate electrode of the driving thin-film transistor T1 together. The compensation thin-film transistor T3 may be turned on according to the scan signal Sn received via the main scan line SLm and connect the gate electrode and the drain electrode of the driving thin-film transistor T1 to each other, to diode-connect the driving thin-film transistor T1.

A gate electrode of the first initialization thin-film transistor T4 may be connected to the previous scan line SL−1. A drain electrode of the first initialization thin-film transistor T4 may be connected to an initialization voltage line VL. The source electrode of the first initialization thin-film transistor T4 may be connected to any one electrode of the storage capacitor Cst, the drain electrode of the compensation thin-film transistor T3, and the gate electrode of the driving thin-film transistor T1 together. The first initialization thin-film transistor T4 may be turned on according to a previous scan signal Sn−1 received via the previous scan line SL−1 and perform an initialization operation of transmitting an initialization voltage Vint to the gate electrode of the driving thin-film transistor T1 and initializing a voltage of the gate electrode of the driving thin-film transistor T1.

A gate electrode of the operation control thin-film transistor T5 may be connected to the emission control line EL. A source electrode of the operation control thin-film transistor T5 may be connected to the main driving voltage line PLm. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 are simultaneously turned on according to an emission control signal En received via the emission control line EL so that a driving voltage ELVDD is transmitted to the organic light-emitting diode OLED and a driving current flows through the organic light-emitting diode OLED.

A gate electrode of the second initialization thin-film transistor T7 may be connected to the next scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on according to the next scan signal Sn+1 received via the next scan line SL+1 and initialize the pixel electrode of the organic light-emitting diode OLED.

In FIG. 7B, the first initialization thin-film transistor T4 and the second initialization thin-film transistor T7 are connected to the previous scan line SL−1 and the next scan line SL+1, respectively, but the present disclosure is not limited thereto. In another embodiment, both the first initialization thin-film transistor T4 and the second initialization thin-film transistor T7 are connected to the previous scan line SL−1 and may be driven according to the previous scan signal Sn−1.

The other electrode of the storage capacitor Cst may be connected to the main driving voltage line PLm. Any one electrode of the storage capacitor Cst may be connected to the gate electrode of the driving thin-film transistor T1, the drain electrode of the compensation thin-film transistor T3, and the source electrode of the first initialization thin-film transistor T4 together.

An opposite electrode (for example, a cathode) of the organic light-emitting diode OLED may receive a common voltage ELVSS. The organic light-emitting diode OLED may receive a driving current from the driving thin-film transistor T1 and emit light.

The main pixel circuit PCm and the auxiliary pixel circuit PCa provided in an embodiment of the present disclosure are not limited to the number of thin-film transistors, the number of storage capacitors, and the circuit design described with reference to FIGS. 7A and 7B, and the number of thin-film transistors, the number of storage capacitors, and the circuit design may be variously modified.

Figure 8:
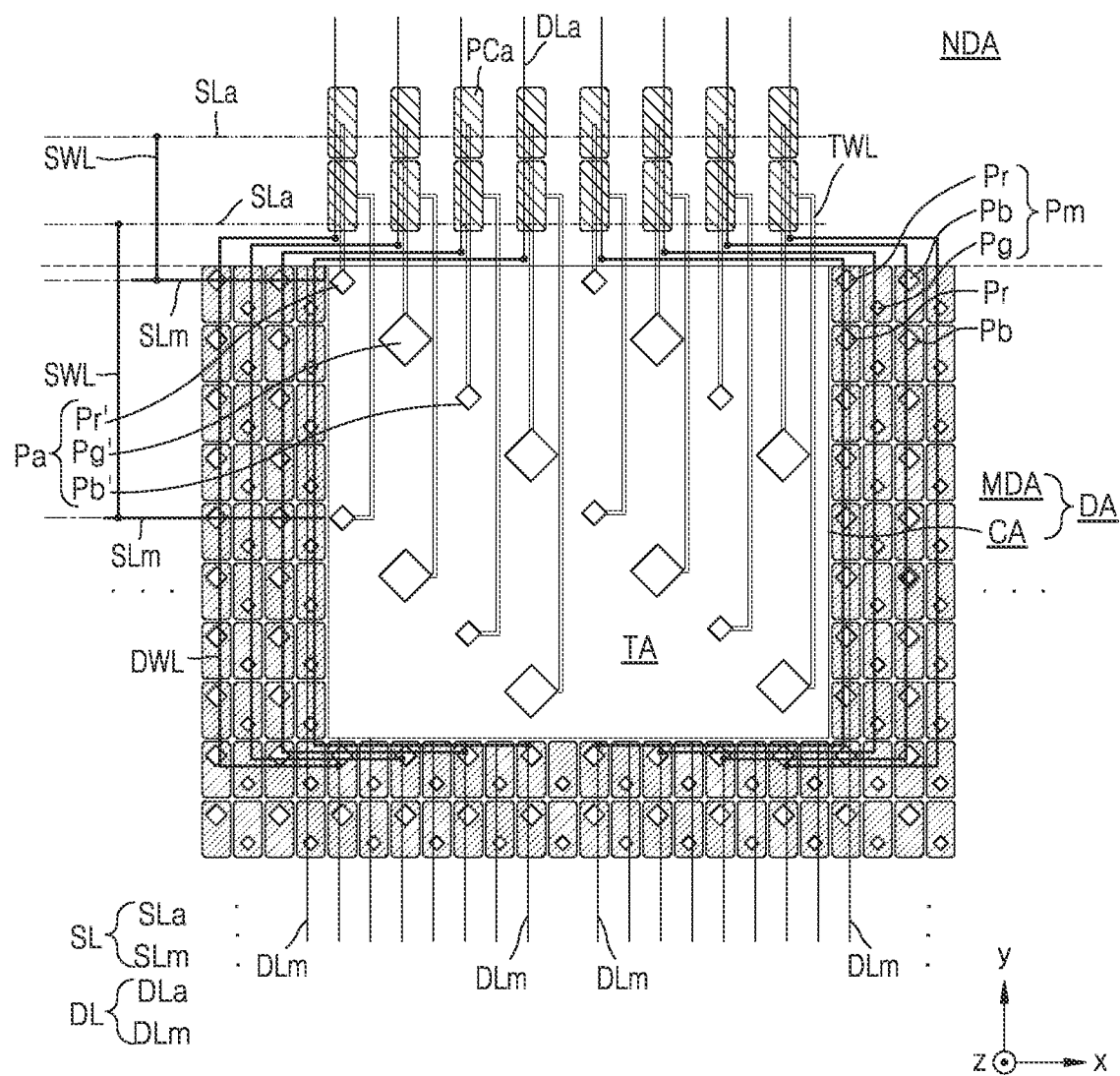
FIG. 8 is a plan view schematically illustrating an area of a display apparatus according to an embodiment.

FIG. 8 is a plan view schematically illustrating an area of a display apparatus according to an embodiment. For example, FIG. 8 shows a component area CA and a portion of the main display area MDA and the peripheral area NDA adjacent to the component area CA.

Referring to FIG. 8, a plurality of main sub-pixels Pm may be arranged in the main display area MDA. In the present disclosure, the term "sub-pixel" refers to a minimum unit for implementing an image and an emission area in which light is emitted by a display element. When an organic light-emitting diode is implemented as a display element, the emission area may be defined by an opening of a pixel-defining layer. This will be described later below. Each of the plurality of main sub-pixels Pm may emit one of red, green, blue, and white light.

In an embodiment, each of the main sub-pixels Pm arranged in the main display area MDA may include a first sub-pixel Pr, a second sub-pixel Pg, and a third sub-pixel Pb. The first sub-pixel Pr, the second sub-pixel Pg, and the third sub-pixel Pb may implement red, green, and blue light, respectively. The main sub-pixels Pm may be arranged in a pentile structure.

For example, from among vertices of a virtual quadrilateral having a central point thereof at a central point of the second sub-pixel Pg, the first sub-pixel Pr may be arranged at first and third vertices facing each other, and the third sub-pixel Pb may be arranged at second and fourth vertices that are remaining vertices. In an embodiment, a size (i.e., an emission area) of the second sub-pixel Pg may be less than a size (i.e., an emission area) of each of the first sub-pixel Pr and the third sub-pixel Pb.

This pixel arrangement structure is referred to as a pentile matrix structure, or a pentile structure, and by applying a rendering driving that expresses a color by sharing neighboring pixels, a high resolution may be implemented with a small number of pixels.

In FIG. 8, the plurality of main sub-pixels Pm are arranged in a pentile matrix structure, but the present disclosure is not limited thereto. For example, the plurality of main sub-pixels Pm may be arranged in various configurations, such as a stripe structure, a mosaic arrangement structure, a delta arrangement structure, and the like.

In the main display area MDA, main pixel circuits PCm may overlap the main sub-pixels Pm, and the main sub-pixels Pm may be arranged in a matrix form in an x direction or a y direction. In the present disclosure, the main pixel circuit PCm may refer to a unit of pixel circuit that implements one main sub-pixel Pm.

A plurality of auxiliary sub-pixels Pa may be arranged in the component area CA. Each of the plurality of auxiliary sub-pixels Pa may emit one of red, green, blue, and white light. The auxiliary sub-pixels Pa may include a first sub-pixel Pr', a second sub-pixel Pg', and a third sub-pixel Pb' that emit light of different colors from one another. The first sub-pixel Pr', and the second sub-pixel Pg', and the third sub-pixel Pb' may implement red, green, and blue light, respectively.

The number of auxiliary sub-pixels Pa per unit area of the component area CA may be less than the number of main sub-pixels Pm per unit area of the main display area MDA. For example, the number of auxiliary sub-pixels Pa and the number of main sub-pixels Pm per same area may be provided in a ratio of 1:2, 1:4, 1:8, and 1:9. In other words, a resolution of the component area CA may be ½, ¼, ⅛, and ⅑ that of the main display area MDA. FIG. 5A shows that the resolution of the component area CA is ⅛ that of the main display area MDA.

The auxiliary sub-pixels Pa arranged in the component area CA may be arranged in various shapes. Some auxiliary sub-pixels Pa may collectively form a pixel group, and the auxiliary sub-pixels Pa may be arranged in various shapes, such as a pentile structure, a stripe structure, a mosaic arrangement structure, and a delta arrangement structure, within the pixel group. In this case, a distance between the auxiliary sub-pixels Pa arranged in the pixel group may be equal to a distance between the main sub-pixels Pm arranged in the pixel group.

In some embodiments, as shown in FIG. 8, the auxiliary sub-pixels Pa may be dispersed in the component area CA. In other words, the distance between the auxiliary sub-pixels Pa may be greater than the distance between the main sub-pixels Pm. Meanwhile, an area of the component area CA in which the auxiliary sub-pixels Pa are not arranged may be referred to as a transmission area TA having a high light transmittance.

Auxiliary pixel circuits PCa implementing emission of the auxiliary sub-pixels Pa may be arranged in the peripheral area NDA. The auxiliary pixel circuits PCa are not arranged in the component area CA, and thus, a size of the transmission area TA of the component area CA may increase.

The auxiliary pixel circuits PCa may be connected to the auxiliary sub-pixels Pa, respectively, by a connection line TWL. Accordingly, when a length of the connection line TWL increases, a resistor-capacitor (RC) delay may occur, and thus, the auxiliary pixel circuits PCa may be arranged by taking into account lengths of the connection lines TWL.

In an embodiment, the auxiliary pixel circuit PCa may be arranged on an extension line that connects the auxiliary sub-pixels Pa arranged in y-direction to each other. In addition, the auxiliary pixel circuits PCa may be arranged in the y-direction as many as the number of auxiliary sub-pixels Pa arranged in the y-direction. For example, when two auxiliary sub-pixels Pa are arranged in the y-direction in the component area CA as shown in FIG. 8, two auxiliary pixel circuits PCa may be arranged in the y direction in the peripheral area NDA.

The connection lines TWL may extend in the y-direction and connect the auxiliary sub-pixels Pa and the auxiliary pixel circuits PCa to each other. That the connection line TWL is connected to the auxiliary sub-pixel Pa may mean that the connection line TWL is electrically connected to a pixel electrode of a display element implementing the auxiliary sub-pixel Pa.

A scan line SL may include a main scan line SLm connected to the main pixel circuits PCm connected to the main pixel circuits PCm, and an auxiliary scan line SLa connected to the auxiliary pixel circuits PCa. The main scan line SLm may extend in the x-direction and be connected to the main pixel circuits PCm arranged in a same row. The main scan line SLm may not be arranged in the component area CA. In other words, the main scan line SLm may be disconnected with the component area CA therebetween. In this case, the main scan line SLm arranged at a left side of the component area CA may receive a signal from the first scan driving circuit SDR1 (see FIG. 6), and the main scan line SLm arranged at a right side of the component area CA may receive a signal from the second scan driving circuit SDR2 (see FIG. 6).

The auxiliary scan line SLa may extend in the x-direction and be connected to the auxiliary pixel circuits PCa arranged in the same row. The auxiliary scan line SLa may be arranged in the peripheral area NDA.

The main scan line SLm and the auxiliary scan line SLa are connected to each other by a scan connection line SWL, and the same signal may be transmitted to pixel circuits configured to drive the main sub-pixel Pm and the auxiliary sub-pixel Pa arranged in a same row. The scan connection line SWL is arranged on a different layer from the layer on which the main scan line SLm and the auxiliary scan line SLa are arranged, and may be connected to each of the main scan line SLm and the auxiliary scan line SLa through contact holes. The scan connection line SWL may be arranged in the peripheral area NDA.

A data line DL may include a main data line DLm connected to the main pixel circuits PCm, and an auxiliary data line DLa connected to the auxiliary pixel circuits PCa. The main data line DLm may extend in the y-direction and be connected to the main data lines DLm arranged in the same column. The auxiliary data line DLa may extend in the y-direction and be connected to the auxiliary pixel circuits PCa arranged in the same column.

The main data line DLm and the auxiliary data line DLa may be spaced apart from each other with the component area CA therebetween. The main data line DLm and the auxiliary data line DLa are connected to each other by a data connection line DWL, and a same signal may be transmitted to pixel circuits configured to drive the main sub-pixel Pm and the auxiliary sub-pixel Pa arranged in a same column.

The data connection line DWL may bypass the component area CA. In an embodiment, the data connection line DWL may overlap the main pixel circuits PCm arranged in the main display area MDA. As the data connection line DWL is arranged in the main display area MDA, it is not necessary to secure a separate space for the data connection line DWL, and thus, an area of a dead space may be minimized.

In another embodiment, the data connection line DWL may be arranged in an intermediate area (not shown) between the main display area MDA and the component area CA.

The data connection line DWL is arranged on a different layer from the layer on which the main data line DLm and the auxiliary data line DLa are arranged, and may be connected to each of the main data line DLm and the auxiliary data line DLa through contact holes.

In FIG. 8, the connection line TWL is integrally formed as a single body with the auxiliary sub-pixels Pa from the peripheral area NDA to the component area CA, but the present disclosure is not limited thereto.

Figure 9:
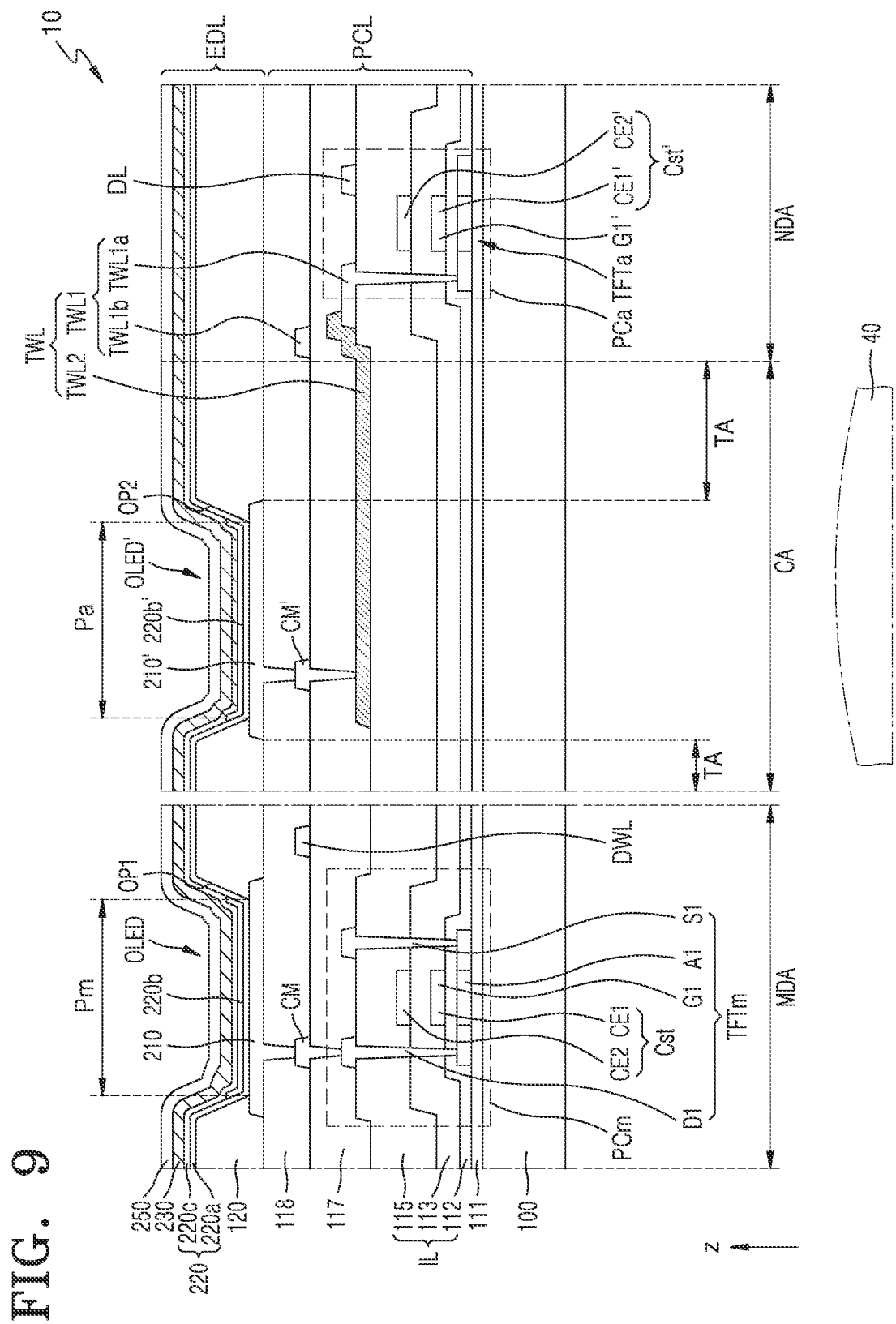
FIG. 9 is a cross-sectional view schematically illustrating part of a display apparatus according to an embodiment.

As shown in FIG. 9 that will be described below, the connection line TWL may include a first connection line TWL1 and a second connection line TWL2 that include different materials from each other.

FIG. 9 is a cross-sectional view schematically illustrating part of a display apparatus according to an embodiment.

FIG. 9 is a schematic cross-sectional view illustrating part of a display panel 10 according to an embodiment and schematically illustrates a main display area MDA, a component area CA, and a portion of a peripheral area NDA.

Referring to FIG. 9, a main sub-pixel Pm is arranged in the main display area MDA, and the component area CA includes an auxiliary sub-pixel Pa and a transmission area TA. In the main display area MDA, a main pixel circuit PCm including a main thin-film transistor TFTm and a main storage capacitor Cst, and a main organic light-emitting diode OLED as a display element connected to the main pixel circuit PCm. An auxiliary organic light-emitting diode OLED' may be arranged in the component area CA. An auxiliary pixel circuit PCa including an auxiliary thin-film transistor TFTa and an auxiliary storage capacitor Cst' may be arranged in the peripheral area NDA. Meanwhile, a connection line TWL connecting the auxiliary pixel circuit PCa and the auxiliary organic light-emitting diode OLED' to each other may be arranged in the component area CA and the peripheral area NDA.

A stacked structure of elements included in the display panel 10 will now be described below. The display panel 10 may include a substrate 100, a buffer layer 111, a circuit layer PCL, and display element layer EDL, which are stacked.

The substrate 100 may include an insulating material such as glass, quartz, a polymer resin, and the like. The substrate 100 may be a rigid substrate or a flexible substrate that is bendable, foldable, rollable, or the like.

The buffer layer 111 may be located on the substrate 100 and reduce or block the penetration of foreign materials, moisture, or ambient air into a lower portion of the substrate 100, and may provide a flat surface on the substrate 100. The buffer layer 111 may include an inorganic material, such as oxide or nitride, an organic material, or an organic and inorganic compound, and may have a single-layer structure or a multi-layer structure including an inorganic material and/or an organic material. A barrier layer (not shown) for blocking the penetration of ambient air may be further included between the substrate 100 and the buffer layer 111. In an embodiment, the buffer layer 111 may include one of silicon oxide ($SiO_2$), silicon nitride ($SiN_x$), and silicon oxynitride (SiON).

The circuit layer PCL is arranged on the buffer layer 111 and may include the main and auxiliary pixel circuits PCm and PCa, a first gate insulating layer 112, a second gate insulating layer 113, an interlayer insulating layer 115, a first planarization layer 117, and a second planarization layer 118. The main pixel circuit PCm may include the main thin-film transistor TFTm and the main storage capacitor Cst, and the auxiliary pixel circuit PCa may include the auxiliary thin-film transistor TFTa and the auxiliary storage capacitor Cst'.

The main thin-film transistor TFTm and the auxiliary thin-film transistor TFTa may be arranged on the buffer layer 111. The main thin-film transistor TFTm may include a semiconductor layer A1, a gate electrode G1, a source electrode S1, and a drain electrode D1. The main thin-film transistor TFTm may be connected to the main organic light-emitting diode OLED and drive the main organic light-emitting diode OLED. The auxiliary thin-film transistor TFTa may be connected to the auxiliary organic light-emitting diode OLED' and drive the auxiliary organic light-emitting diode OLED'. The auxiliary thin-film transistor TFTa has a similar structure to a structure of the main thin-film transistor TFTm, and thus, a description of the auxiliary thin-film transistor TFTa may be as the description of the main thin-film transistor TFTm. For example, the auxiliary thin-film transistor TFTa may include a semiconductor layer, a gate electrode, a source electrode, and a drain electrode.

The semiconductor layer A1 is arranged on the buffer layer 111 and may include polysilicon. In another embodiment, the semiconductor layer A1 may include amorphous silicon. In another embodiment, the semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A1 may include a channel area, a source area, and a drain area, the source area and the drain area being doped with impurities.

The first gate insulating layer 112 may cover the semiconductor layer A1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), zinc oxide (ZnO), or the like. The first gate insulating layer 112 may include a single layer or multiple layers including the above-described inorganic insulating material.

The gate electrode G1 may be arranged on the first gate insulating layer 112 so as to overlap the semiconductor layer A1. The gate electrode G1 may include molybdenum (Mo), aluminum (Al), copper (Cu), titanium (Ti), or the like and may include a single layer or multiple layers. For example, the gate electrode G1 may be a single Mo layer.

The second gate insulating layer 113 may cover the gate electrode G1 of the main thin-film transistor TFTm and the gate electrode G1' of the auxiliary thin-film transistor TFTa. The second gate insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), zinc oxide (ZnO), or the like. The second gate insulating layer 113 may include a single layer or multiple layers including the inorganic insulating material described above.

An upper electrode CE2 of the main storage capacitor Cst and an upper electrode CE2' of the auxiliary storage capacitor Cst' may be arranged on the second gate insulating layer 113.

In the main display area MDA, the upper electrode CE2 of the main storage capacitor Cst may overlap the gate electrode G1 therebelow. The gate electrode G1 and the upper electrode CE2 overlapping each other with the second gate insulating layer 113 therebetween may form the main storage capacitor Cst. The gate electrode G1 may be a lower electrode CE1 of the main storage capacitor Cst.

In the peripheral area NDA, the upper electrode CE2' of the auxiliary storage capacitor Cst' may overlap a gate electrode G1' of the auxiliary thin-film transistor TFTa therebelow. The gate electrode G1' of the auxiliary thin-film transistor TFTa may be a lower electrode CE1' of the auxiliary storage capacitor Cst'.

Each of the upper electrodes CE2 and CE2' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers of the above material(s).

The interlayer insulating layer 115 may cover the upper electrodes CE2 and CE2'. The interlayer insulating layer 115 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The interlayer insulating layer 115 may be a single layer or multiple layers including the inorganic insulating material described above.

The source electrode S1 and the drain electrode D1 may be arranged on the interlayer insulating layer 115. Each of the source electrode S1 and the drain electrode D1 may include a conductive material including molybdenum (Mo), aluminum (Al), copper (Cu), titanium (Ti), or the like and may include multiple layers or a single layer including the material described above. For example, each of the source electrode S1 and the drain electrode D1 may have a multilayer structure of a Ti layer, an Al layer, and another Ti layer.

The connection line TWL connected to the auxiliary pixel circuit PCa may be arranged on the interlayer insulating layer 115. The connection line TWL extends from the peripheral area NDA to the component area CA and may connect the auxiliary organic light-emitting diode OLED' and the auxiliary pixel circuit PCa to each other. In addition, a data line DL may be arranged on the interlayer insulating layer 115.

In an embodiment, the connection line TWL may include the first connection line TWL1 and the second connection line TWL2. In the cross-sectional view of FIG. 9, the connection line TWL may correspond to the connection line TW of FIG. 8 described above.

The first connection line TWL1 is arranged in the peripheral area NDA and may be connected to the auxiliary pixel circuit PCa, for example, the auxiliary thin-film transistor TFTa. The second connection line TWL2 is connected to the first connection line TWL1 and may be arranged in the transmission area TA of the component area CA. The second connection line TWL2 is arranged on the same layer as the first connection line TWL1, but may include a material different from the material of the first connection line TWL1. One end of the second connection line TWL2 may cover one end of the first connection line TWL1.

In another embodiment, the first connection line TWL1 may be arranged on a different layer from the layer on which the second connection line TWL2 is arranged. Although not shown, the first connection line TWL1 may be arranged on the interlayer insulating layer 115 as shown in FIG. 9, and the second connection line TWL2 may be arranged on the interlayer insulating layer 115. In this case, the first connection line TWL1 and the second connection line TWL2 may directly contact each other on the same layer. In another embodiment, although not shown, the first connection line TWL1 and the second connection line TWL2 may be connected to each other through a contact hole defined in the first planarization layer 117.

The first connection line TWL1 may include a conductive material including molybdenum (Mo), aluminum (Al), copper (Cu), titanium (Ti), etc., and may include multiple layers or a single layer including the above material. The first connection line TWL1 may include a $(1-1)^{st}$ connection line TWL1a and a $(1-2)^{nd}$ connection line TWL1b arranged on different layers from each other. In an embodiment, the $(1-1)^{st}$ connection line TWL1a is arranged on a same layer as a layer on which the data line DL is arranged, and may include a same material as the data line DL. The $(1-2)^{nd}$ connection line TWL1b and the $(1-1)^{st}$ connection line TWL1a may be arranged with the first planarization layer 117 therebetween. The $(1-2)^{nd}$ connection line TWL1b may be arranged on the first planarization layer 117, which is a same layer as a layer on which the connection electrodes CM and CM' are arranged. In another embodiment, the $(1-2)^{nd}$ connection line TWL1b may be arranged on a same layer as the upper electrode CE2 or the lower electrode CE1 of the main storage capacitor Cst.

The second connection line TWL2 may include a transparent conductive material. For example, the connection line TWL may include a transparent conducting oxide (TCO). The connection line TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The first connection line TWL1 may have a greater conductivity than the second connection line TWL2. Because the first connection line TWL1 is arranged in the peripheral area NDA, it is not necessary to secure a light transmittance, and thus, a material having a less light transmittance but having a greater conductivity than the second connection line TWL2 may be used. Accordingly, a resistance of the connection line TWL may be minimized.

The first planarization layer 117 and the second planarization layer 118 may cover the source electrode S1, the drain electrode D1, and the connection line TWL. Each of the first and second planarization layers 117 and 118 may include a flat upper surface so that a main pixel electrode 210 and an auxiliary pixel electrode 210' arranged thereon may be formed flat.

Each of the first and second planarization layers 117 and 118 may include an organic material or an inorganic material, and may include a single-layer structure or a multi-layer structure. A conductive pattern, such as a line and the like, may be formed between the first planarization layer 117 and the second planarization layer 118, and thus, it may be advantageous for high integration. The connection electrodes CM and CM' and a data connection line DWL may be arranged on the first planarization layer 117.

The first planarization layer 117 may include benzocyclobutene (BCB), polyimide, hexamethyldisiloxane (HMDSO), a general-purpose polymer such as poly(methyl methacrylate) (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like. Meanwhile, the first planarization layer 117 may include an inorganic insulating material such as silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide (ZnO), or the like. When the first planarization layer 117 is formed, in order to provide a flat upper surface after forming the first planarization layer 117, chemical mechanical polishing may be performed on an upper surface of the first planarization layer 117.

The first planarization layer 117 may cover the main pixel circuit PCm and the auxiliary pixel circuit PCa. The second planarization layer 118 is arranged on the first planarization layer 117 and may have a flat upper surface so that the main and auxiliary pixel electrodes 210 and 210' may be formed flat.

The main and auxiliary organic light-emitting diodes OLED and OLED' are arranged on the second planarization layer 118. The main pixel electrode 210 of the main organic light-emitting diode OLED and the auxiliary pixel electrode 210' of the auxiliary organic light-emitting diode may be respectively connected to the main pixel circuit PCm and the auxiliary pixel circuit PCa through the connection electrodes CM and CM'.

Each of the main pixel electrode 210 and the auxiliary pixel electrode 210' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). Each of the main pixel electrode 210 and the auxiliary pixel electrode 210' may include a reflective film including silver (Ag), magnesium (Mg), aluminum (Al), platinum (Pt), palladium (Pd), gold (Au), nickel (Ni), neodymium (Nd), iridium (Ir), chrome (Cr), or any compounds thereof. For example, each of the main pixel electrode 210 and the auxiliary pixel electrode 210' may have a structure having films including ITO, IZO, ZnO, or $In_2O_3$ above/below the reflective film. In this case, each of the main pixel electrode 210 and the auxiliary pixel electrode 210' may have a stacked structure of an ITO layer, an Ag layer, and another ITO layer.

On the second planarization layer 118, a pixel-defining layer 120 covers an edge of each of the main pixel electrode 210 and the auxiliary pixel electrode 210', and a first opening OP1 exposing a central portion of the main pixel electrode 210 and a second opening OP2 exposing a central portion of the auxiliary pixel electrode 210' are defined in the pixel-defining layer 120. Sizes and shapes of emission areas of the main and auxiliary organic light-emitting diodes OLED and OLED', that is, the main and auxiliary sub-pixels Pm and Pa, are defined by the first opening OP1 and the second opening OP2.

The pixel-defining layer 120 may increase a distance between the edges of the main and auxiliary pixel electrodes 210 and 210' and an opposite electrode 230 on the main and auxiliary pixel electrodes 210 and 210', to thereby prevent an arc or the like from occurring at the edge of the main and auxiliary pixel electrodes 210 and 210'. The pixel-defining layer 120 includes an organic insulating material such as polyimide, polyamide, an acrylic resin, BCB, HMDSO, a phenolic resin, and the like, and may be formed by a method such as spin coating and the like.

A main emission layer 220b and an auxiliary emission layer 220b' formed to respectively correspond to the main pixel electrode 210 and the auxiliary pixel electrode 210' are arranged in the first opening OP1 and the second opening OP2 of the pixel-defining layer 120, respectively. Each of the main emission layer 220b and the auxiliary emission layer 220b' may include a polymer material or a low-molecular weight material, and may emit red, green, blue, or white light.

An organic functional layer 220 may be arranged above and/or below the main emission layer 220b and the auxiliary emission layer 220b'. The organic functional layer 220 may include a first functional layer 220a and/or a second functional layer 220c. One of the first functional layer 220a and the second functional layer 220c may be omitted.

The first functional layer 220a may be arranged below the main emission layer 220b and the auxiliary emission layer 220b'. The first functional layer 220a may include a single layer or multiple layers including an organic material. The first functional layer 220a may be a hole transport layer (HTL) having a single-layer structure. In some embodiments, the first functional layer 220a may include a hole injection layer (HIL) and an HTL. The first functional layer 220a may be integrally formed as a single body to correspond to the main and auxiliary organic light-emitting diodes OLED and OLED' respectively included in the main display area MDA and the component area CA.

The second functional layer 220c may be arranged above the main emission layer 220b and the auxiliary emission layer 220b'. The second functional layer 220c may include a single layer or multiple layers including an organic material. The second functional layer 220c may include an electron transport layer (ETL) and/or an electron injection layer (EIL). The second functional layer 220c may be integrally formed as a single body to correspond to the main and auxiliary organic light-emitting diodes OLED and OLED' respectively included in the main display area MDA and the component area CA.

The opposite electrode 230 is arranged above the second functional layer 220c. The opposite electrode 230 may include a conductive material having a low work function. For example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or any alloys thereof. In some embodiments, the opposite electrode 230 may further include a layer including ITO, IZO, ZnO, or $In_2O_3$ on the (semi) transparent layer. The opposite electrode 230 may be integrally formed as a single body to correspond to the main and auxiliary organic light-emitting diodes OLED and OLED' respectively included in the main display area MDA and the component area CA.

Layers from the main pixel electrode 210 to the opposite electrode 230 formed in the main display area MDA may be included in the main organic light-emitting diode OLED. Layers from the auxiliary pixel electrode 210' to the opposite electrode 230 formed in the component area CA may be included in the auxiliary organic light-emitting diode OLED'.

An upper layer 250 including an organic material may be formed on the opposite electrode 230. The upper layer 250 may be a layer provided to protect the opposite electrode 230 and improve light extraction efficiency. The upper layer 250 may include an organic material having a greater refraction index than the opposite electrode 230. In some embodiments, the upper layer 250 may be provided by stacking layers having different refraction indices. For example, the upper layer 250 may have a stacked structure of a high-refractive index layer, a low-refractive index layer, and another high-refractive index layer. A refractive index of the high-refractive index layer may be about 1.7 or greater, and a refractive index of the low-refractive index layer may be about 1.3 or less.

The upper layer 250 may further include lithium fluoride (LiF). In some embodiments, the upper layer 250 may further include an inorganic insulating material such as silicon oxide ($SiO_2$) or silicon nitride ($SiN_X$).

Figure 14:
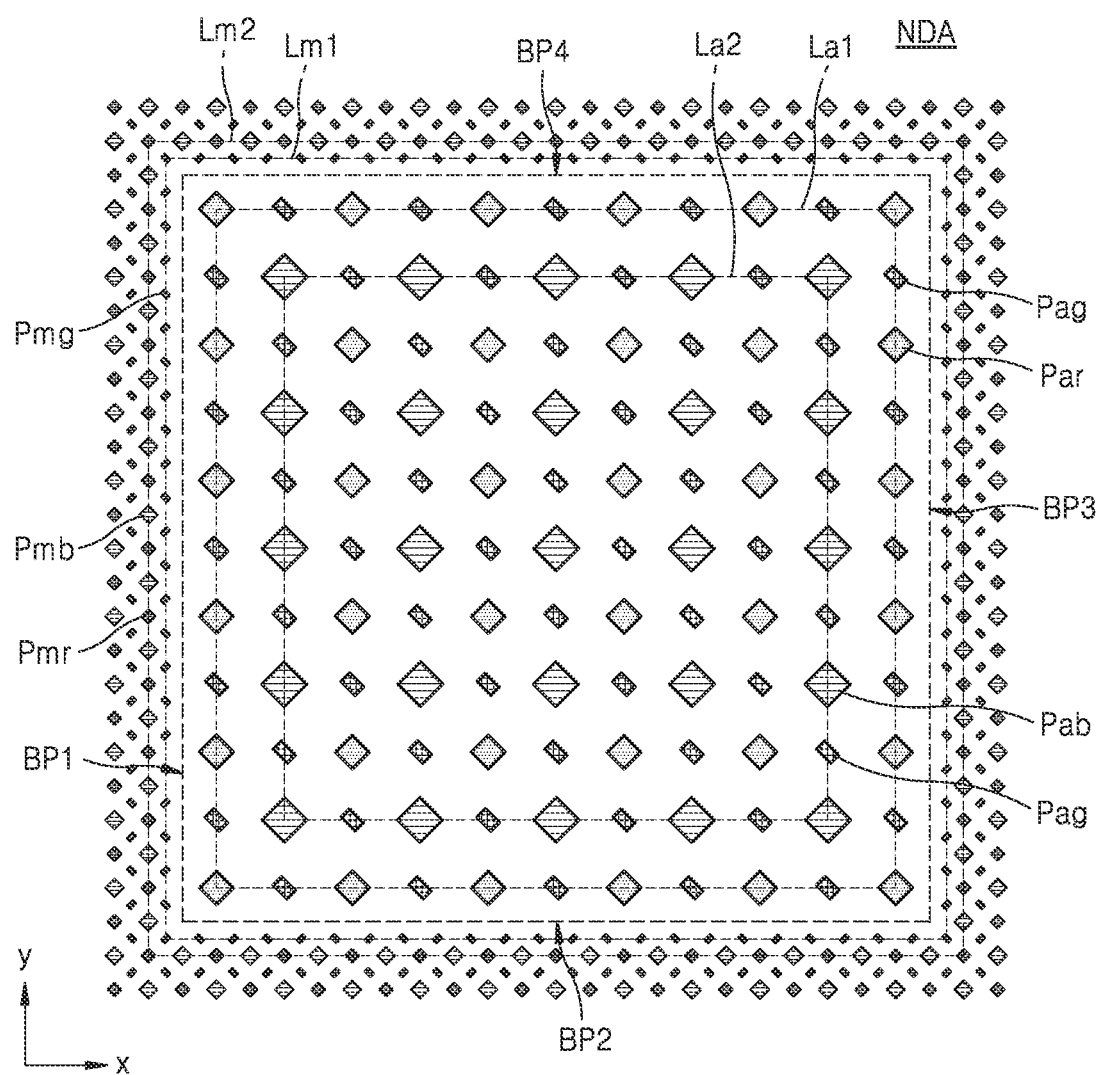
FIG. 14 is a plan view schematically illustrating a pixel arrangement structure according to an embodiment.
Figure 15:
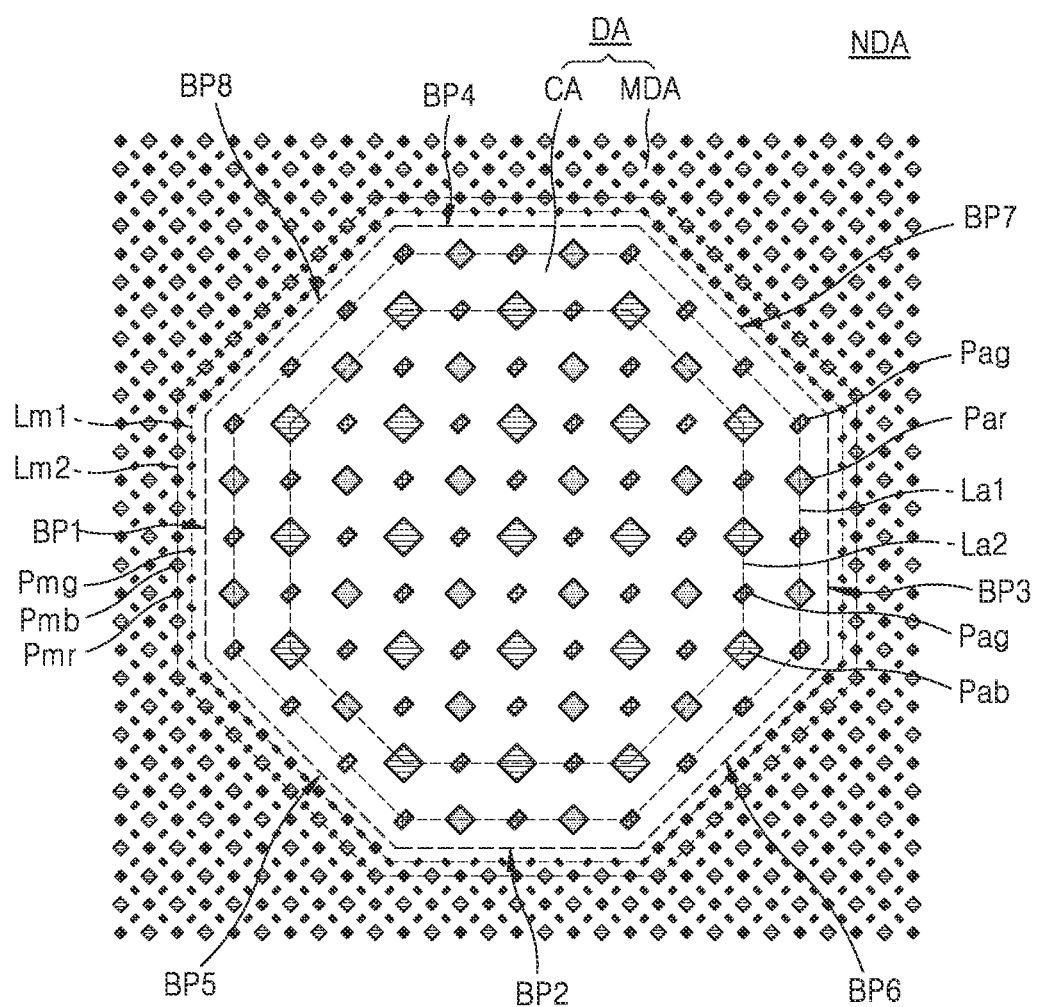
FIG. 15 is a plan view schematically illustrating a pixel arrangement structure according to an embodiment.
Figure 16:
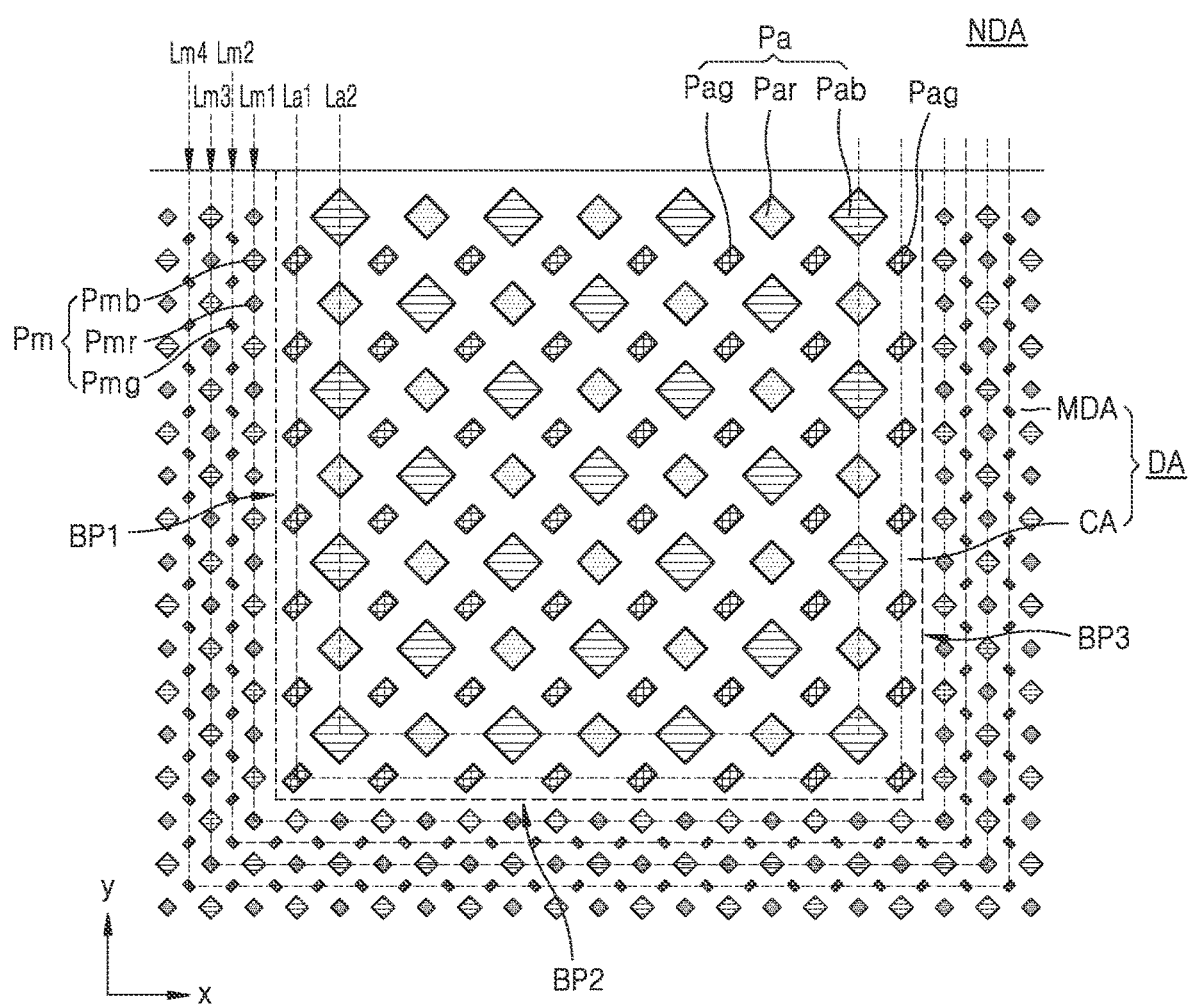
FIG. 16 is a plan view schematically illustrating a pixel arrangement structure according to an embodiment.

A pixel arrangement of the present disclosure will be described below with reference to plan views illustrating a portion of a display area DA around a component area CA. FIGS. 10A, 10B, 11A, 11B, 12A, 12B, 13A, and 13B show embodiments in which a main display area MDA and a component area CA contact each other at three surfaces, FIGS. 14, 15, and 16 show an embodiment in which the main display area MDA and the component area CA contact each other at four surfaces, and FIG. 15 shows an embodiment in which the main display area MDA and the component area CA contact each other at eight surfaces.

In the embodiments of FIGS. 10A, 10B, 11A, 11B, 12A, 12B, 13A, and 13B, sub-pixels (for example, a main sub-pixel Pm and an auxiliary sub-pixel Pa) corresponding to boundary portions BP (for example, a first boundary portion BP1, a second boundary portion BP2, and a third boundary portion BP3) where the main display area MDA and the component area CA meet may have a same arrangement. In other words, the main sub-pixels Pm arranged at an innermost portion of the main display area MDA and the auxiliary sub-pixels arranged at an outermost portion of the component area CA may have a mutually identical arrangement to correspond to each of the boundary portions BP.

Figure 10A:
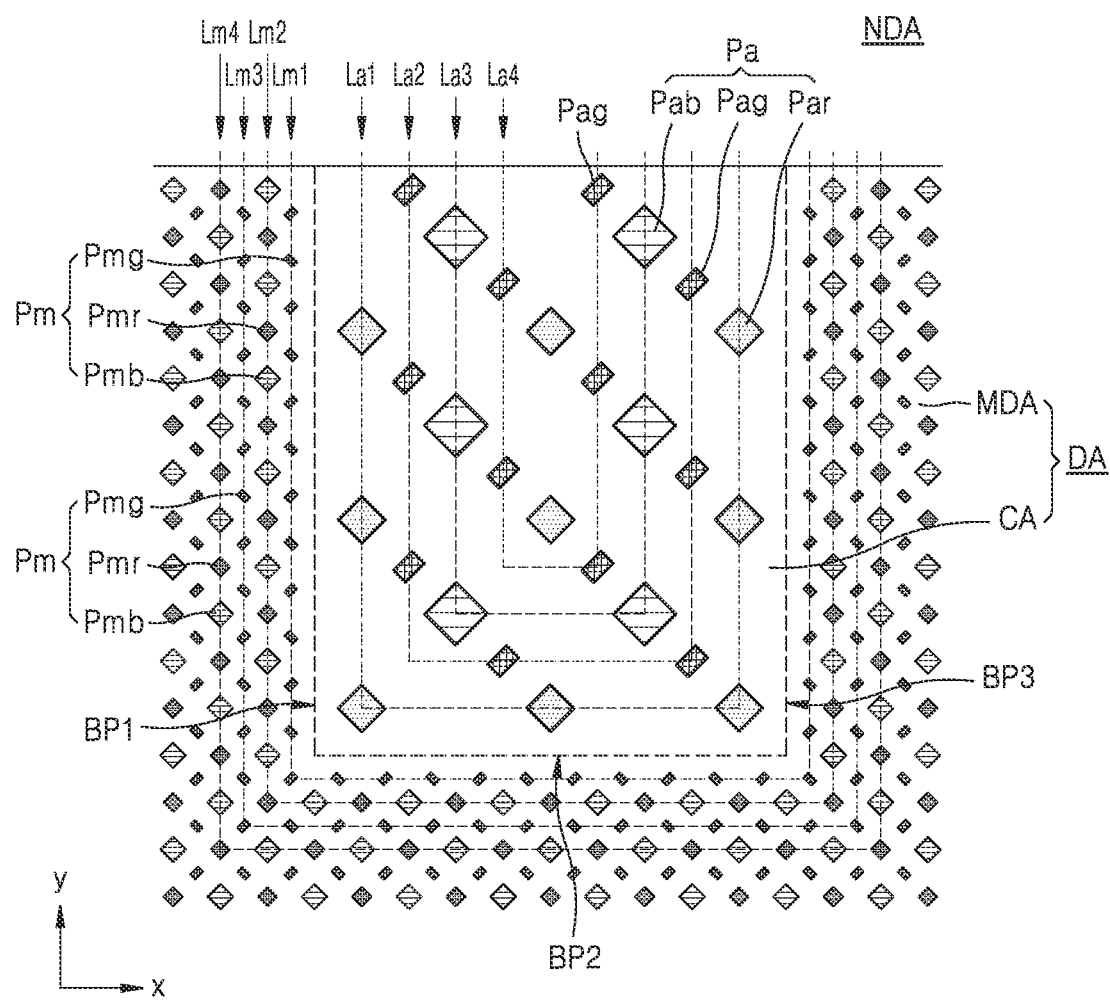
FIGS. 10A and 10B are plan views schematically illustrating a pixel arrangement structure according to an embodiment.
Figure 10B:
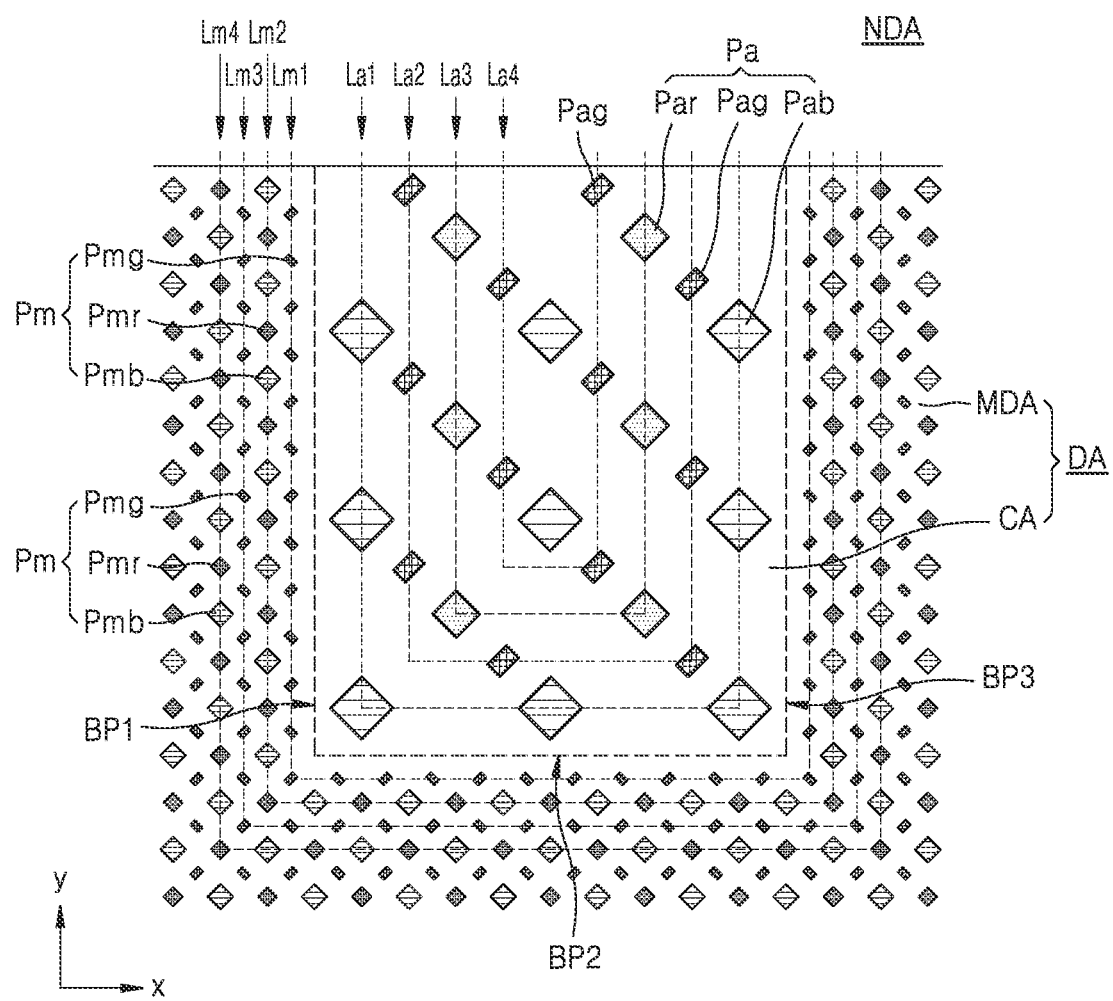
Figure 11A:
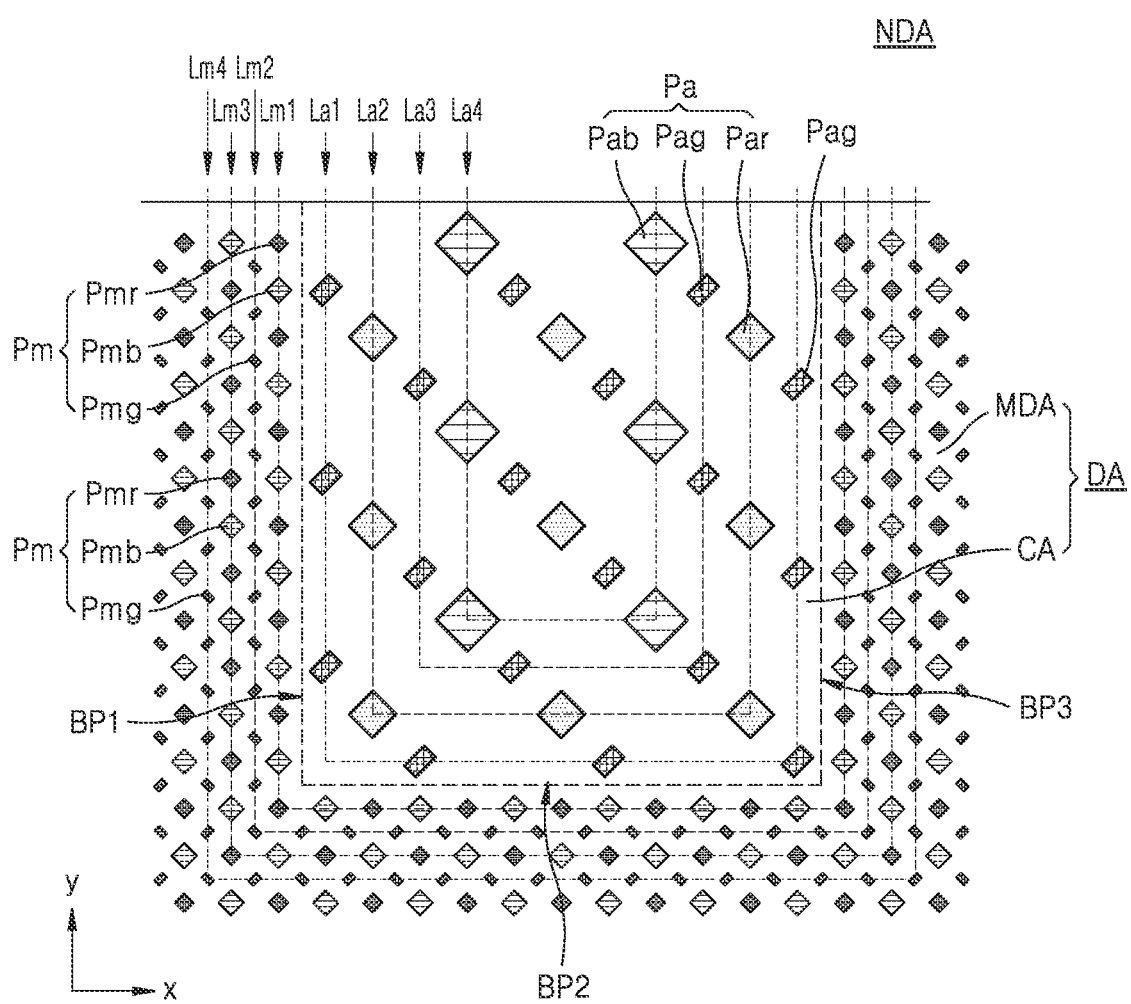
FIGS. 11A and 11B are plan views schematically illustrating a pixel arrangement structure according to an embodiment.
Figure 11B:
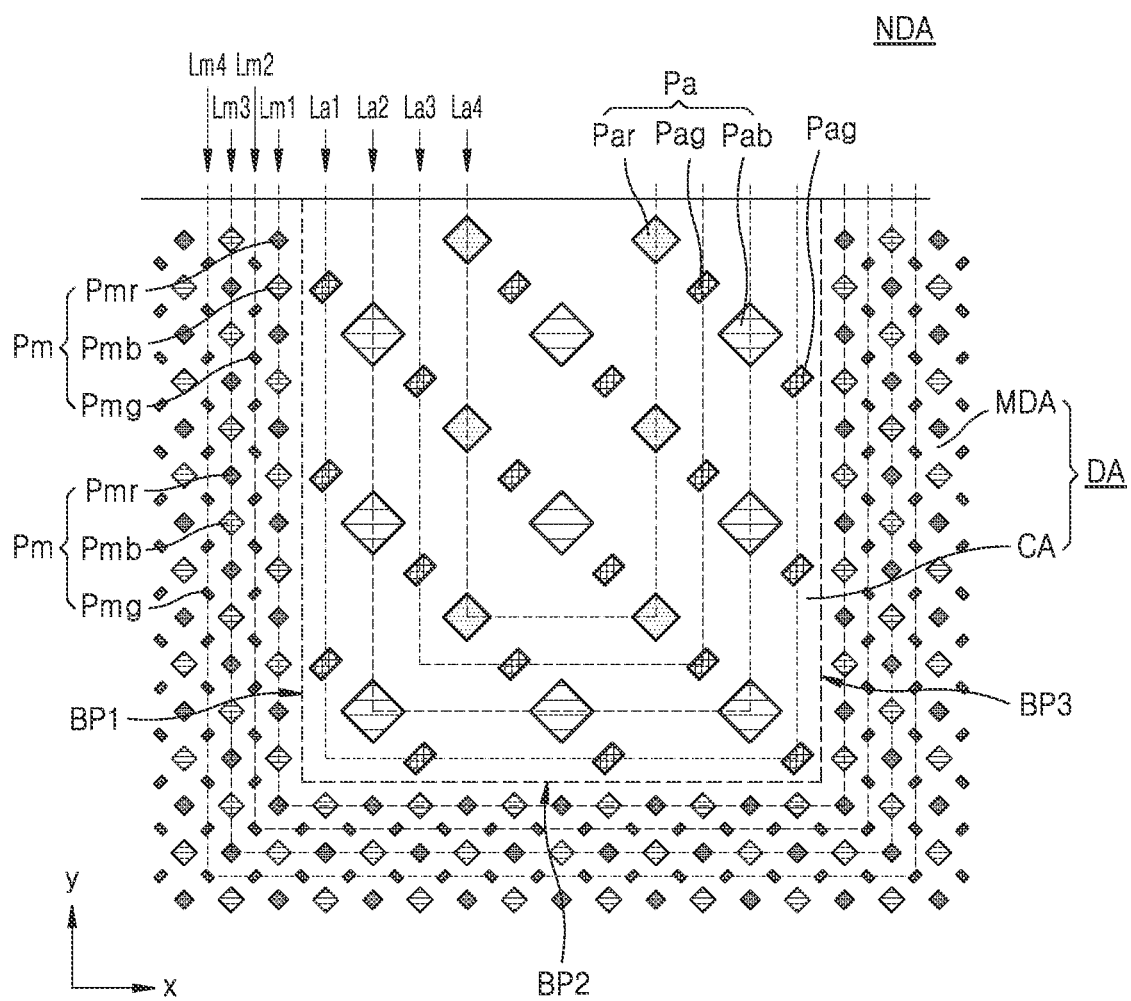

FIGS. 10A and 10B are plan views schematically illustrating a pixel arrangement structure according to an embodiment, and FIGS. 11A and 11B are plan views schematically illustrating a pixel arrangement structure according to an embodiment.

First, in FIGS. 10A, 10B, 11A, and 11B, the auxiliary sub-pixels Pa arranged according to a preset rule may be arranged in the component area CA. The auxiliary sub-pixels Pa arranged in the component area CA may be arranged in "a diagonal direction" crossing the first direction (e.g., y-direction) and the second direction (e.g., x-direction). That the auxiliary sub-pixels Pa are arranged in "a diagonal direction" may mean that only display elements emitting light of a same color are arranged in a same column or row.

In FIGS. 10A and 10B, the main sub-pixels Pm in the main display area MDA have the same arrangement, but there is a difference in arrangement between the auxiliary sub-pixels Pa in the component area CA.

First, referring to the main display area MDA of FIGS. 10A and 10B, the main sub-pixels Pm arranged according to a preset rule may be arranged in the main display area MDA. The main sub-pixels Pm may be arranged to surround the component area CA, and a first main line Lm1, a second main line Lm2, a third main line Lm3, and a fourth main line Lm4 may be defined in an order of arrangement from an innermost portion of the main display area MDA. The main sub-pixels Pm arranged in an outer direction of the fourth main line Lm4, that is, a direction away from the component area CA, may be in a form in which an arrangement of the main sub-pixels Pm of the first main line Lm1 to the fourth main line Lm4 is repeated. In the first main line Lm1, the second main line Lm2, the third main line Lm3, and the fourth main line Lm4 described above, that display elements are arranged on "a line" may mean that the display elements are arranged along a same column or row at one boundary portion.

In an embodiment, a green main sub-pixel Pmg may be arranged on the first main line Lm1, which is an innermost line of the main display area MDA. In other words, the main sub-pixel Pm surrounding the component area CA closest may be green. A red main sub-pixel Pmr and a blue main sub-pixel Pmb may be alternately arranged on the second main line Lm2 adjacent to the first main line Lm1. The green main sub-pixel Pmg may be arranged on the third main line Lm3 adjacent to the second main line Lm2. The blue main sub-pixel Pmb and the red main sub-pixel Pmr may be alternately arranged on the fourth main line Lm4 adjacent to the third main line Lm3. The second main line Lm2 and the fourth main line Lm4 are similar to each other in that they are arranged in an R/B/R/B/R/B order, but when viewed from a same row, when the red main sub-pixel Pmr is arranged on the second main line Lm2, the blue main sub-pixel Pmb is arranged on the third main line Lm3.

Meanwhile, referring to the component area CA of FIG. 10A, the auxiliary sub-pixels Pa arranged in the component area CA may be arranged in "a diagonal direction." That the auxiliary sub-pixels Pa are arranged in "the diagonal direction" may mean that only display elements emitting light of a same color are arranged in a same column or row. For example, when a row of the component area CA closest to the peripheral area NDA is a first row, a green auxiliary sub-pixel Pag may be arranged in the first row, a blue auxiliary sub-pixel Pab may be arranged in a second row, the green auxiliary sub-pixel Pag may be arranged in a third row, and a red auxiliary sub-pixel Par may be arranged in the fourth row. In other words, this may mean that the auxiliary sub-pixels Pa arranged on a same auxiliary line to be described below are display elements emitting light of a same color.

The auxiliary sub-pixel Pa may be defined as a first auxiliary line La1, a second auxiliary line La2, a third auxiliary line La3, and a fourth auxiliary line La4 in an order of arrangement from an outermost portion of the component area CA. The auxiliary sub-pixels Pa, which are arranged in an inner direction of the fourth auxiliary line La4, that is, a direction toward a central portion of the component area CA, may be in a form in which an arrangement of the auxiliary sub-pixels Pa of the first auxiliary line La1 to the fourth auxiliary line La4 are repeated.

In an embodiment, the red auxiliary sub-pixel Par may be arranged on the first auxiliary line La1 that is the outermost line of the component area CA. In other words, the auxiliary sub-pixel Pa closest to the main display area MDA may be red. The green auxiliary sub-pixel Pag may be arranged on the second auxiliary line La2 adjacent to the first auxiliary line La1. The blue auxiliary sub-pixel Pab may be arranged on the third auxiliary line La3 adjacent to the second auxiliary line La2. The green auxiliary sub-pixel Pag may be arranged on the fourth auxiliary line La4 adjacent to the third auxiliary line La3.

As described above, to correspond to the first boundary portion BP1, the second boundary portion BP2, and the third boundary portion BP3 where the main display area MDA and the component area CA meet in the display area DA, the green main sub-pixels Pmg may be continuously arranged at an outer portion of the main display area MDA, and the red auxiliary sub-pixels Par may be continuously arranged at an outer portion of the component area CA. As pixel arrangements (i.e., display element arrangements) of the boundary portions BP where the main display area MDA and the component area CA meet are identical, a difference of visibility among the boundary portions BP may be minimized.

Meanwhile, the component area CA of FIG. 10B is same as that of FIG. 10A in that the auxiliary sub-pixels Pa are arranged in "a diagonal direction," but the component area CA of FIG. 10B is different from that of FIG. 10B in terms of an arrangement order of the auxiliary sub-pixels Pa.

In an embodiment, the blue auxiliary sub-pixel Pab may be arranged on the first auxiliary line La1, which is the outermost line of the component area CA. In other words, the auxiliary sub-pixel Pa closest to the main display area MDA may be blue. The green auxiliary sub-pixel Pag may be arranged on the second auxiliary line La2 adjacent to the first auxiliary line La1. The red auxiliary sub-pixel Par may be arranged on the third auxiliary line La3 adjacent to the second auxiliary line La2. The green auxiliary sub-pixel Pag may be arranged on the fourth auxiliary line La4 adjacent to the third auxiliary line La3.

FIGS. 11A and 11B are the same in terms of an arrangement of the main sub-pixels Pm in the main display area MDA, but are different in terms of an arrangement of the auxiliary sub-pixels Pa in the component area CA.

In an embodiment, the red main sub-pixel Pmr and the blue main sub-pixel Pmb may be alternately arranged on the first main line Lm1, which is the innermost line of the main display area MDA. In other words, the main sub-pixels Pm surrounding the component area CA closest may be red and blue. The green main sub-pixel Pmg may be arranged on the second main line Lm2 adjacent to the first main line Lm1. The red main sub-pixel Pmr and the blue main sub-pixel Pmb may be alternately arranged on the third main line Lm3 adjacent to the second main line Lm2. The green main sub-pixels Pmg may be arranged on the fourth main line Lm4 adjacent to the third main line Lm3. The second main line Lm2 and the fourth main line Lm4 are similar to each other in that they are arranged in an R/B/R/B/R/B order, but when viewed from a same row, when the red main sub-pixel Pmr is arranged on the second main line Lm2, the blue main sub-pixel Pmb is arranged on the third main line Lm3.

Meanwhile, referring to the component area CA of FIG. 11A, the green auxiliary sub-pixel Pag may be arranged on the first auxiliary line La1 that is the outermost line of the component area CA. In other words, the auxiliary sub-pixel Pa closest to the main display area MDA may be green. The red auxiliary sub-pixel Par may be arranged on the second auxiliary line La2 adjacent to the first auxiliary line La1. The green auxiliary sub-pixel Pag may be arranged on the third auxiliary line La3 adjacent to the second auxiliary line La2. The blue auxiliary sub-pixel Pab may be arranged on the fourth auxiliary line La4 adjacent to the third auxiliary line La3.

Similarly, the component area CA of FIG. 11B is different from that of FIG. 11A in terms of an arrangement order of the auxiliary sub-pixels Pa.

In an embodiment, the green auxiliary sub-pixel Pag may be arranged on the first auxiliary line La1 that is the outermost line of the component area CA. In other words, the auxiliary sub-pixel Pa closest to the main display area MDA may be green. The blue auxiliary sub-pixel Pab may be arranged on the second auxiliary line La2 adjacent to the first auxiliary line La1. The green auxiliary sub-pixel Pag may be arranged on the third auxiliary line La3 adjacent to the second auxiliary line La2. The red auxiliary sub-pixel Par may be arranged on the fourth auxiliary line La4 adjacent to the third auxiliary line La3.

Figure 12A:
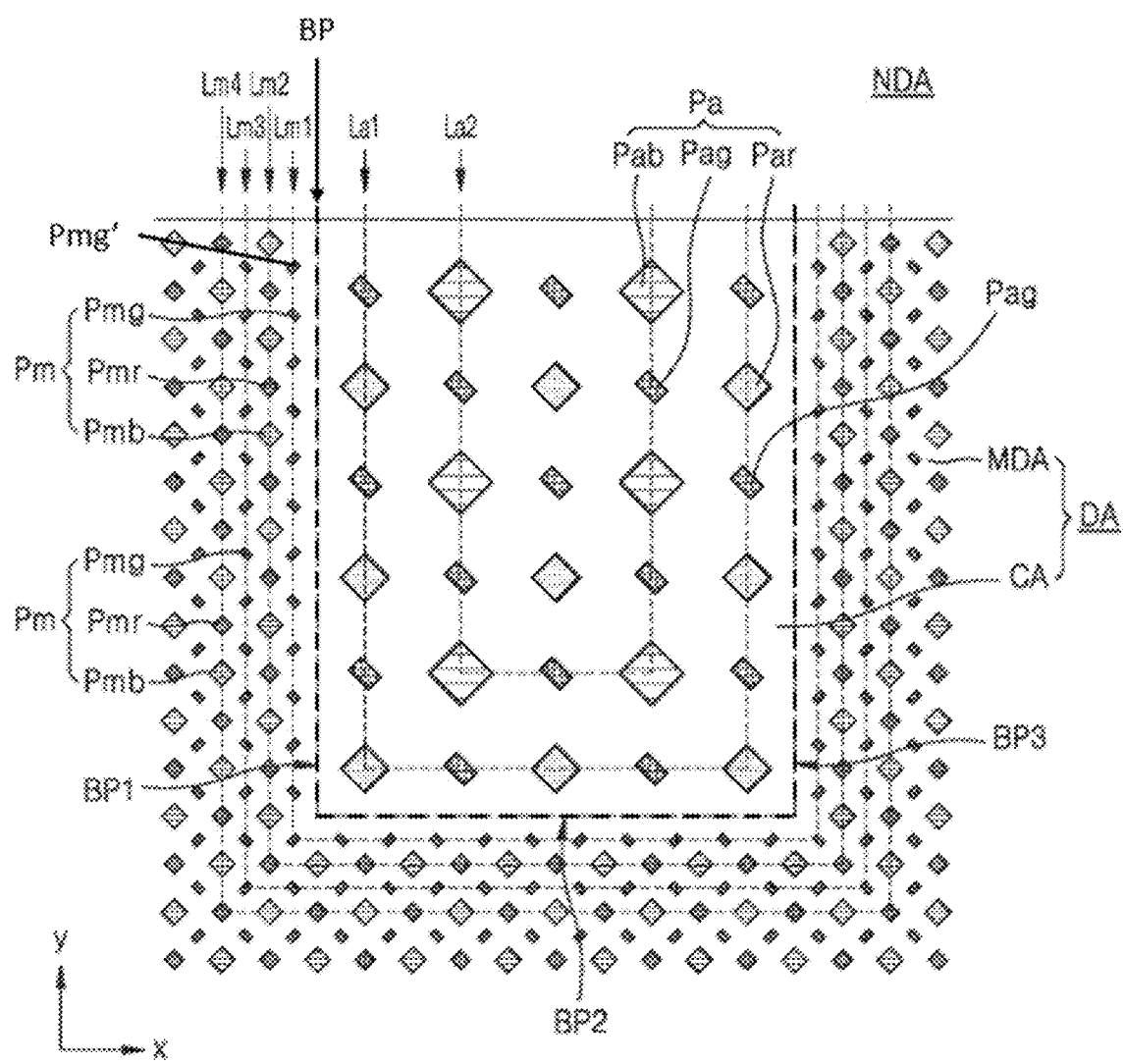
FIGS. 12A and 12B are plan views schematically illustrating a pixel arrangement structure according to an embodiment.
Figure 12B:
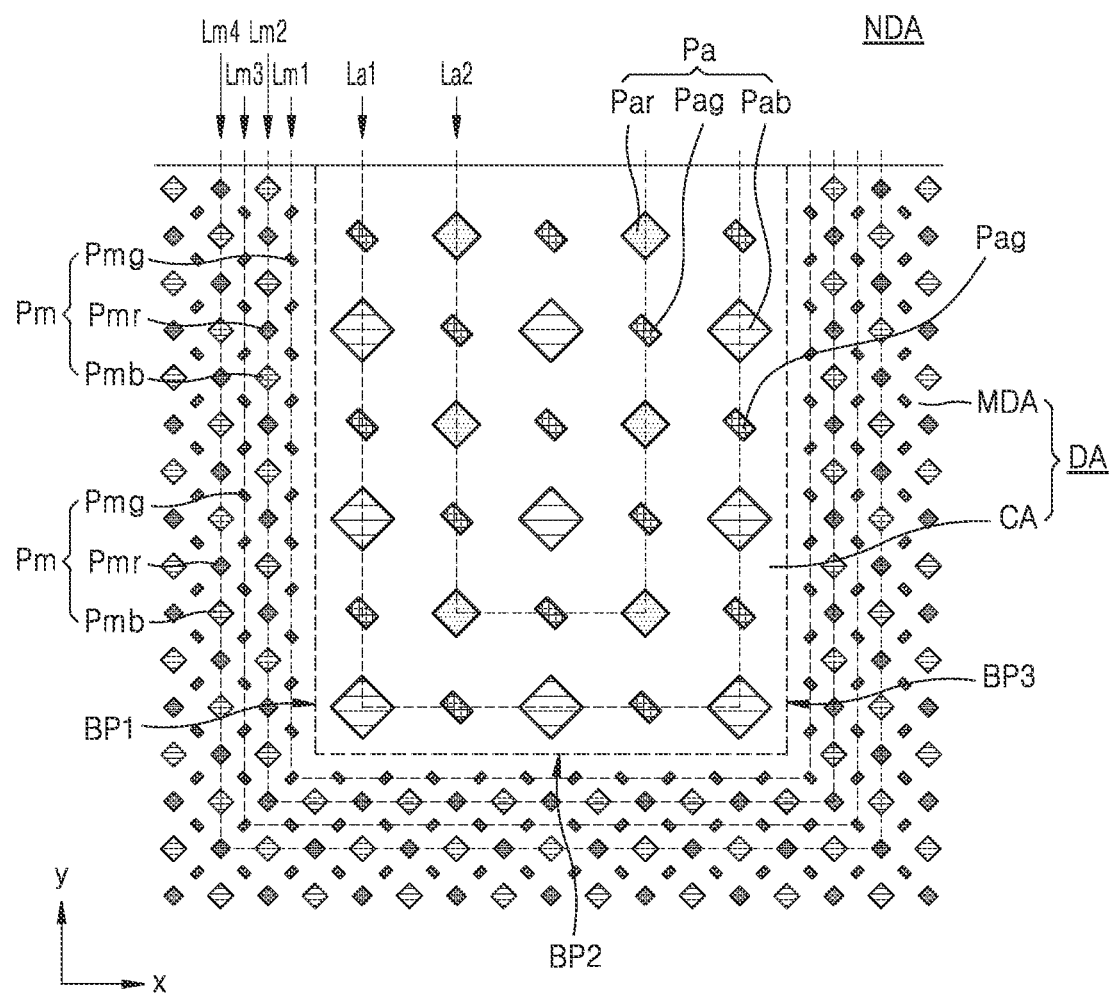
Figure 13A:
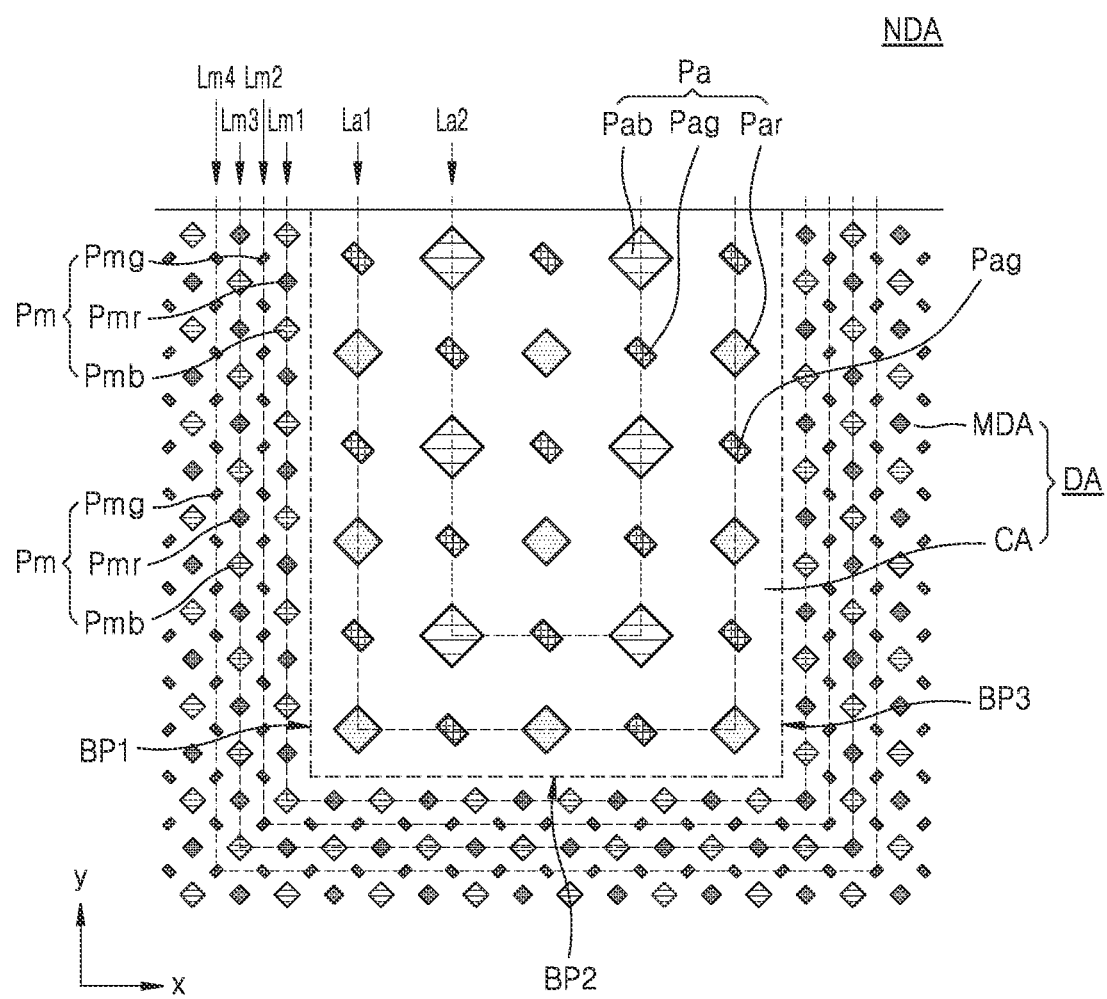
FIGS. 13A and 13B are plan views schematically illustrating a pixel arrangement structure according to an embodiment.
Figure 13B:
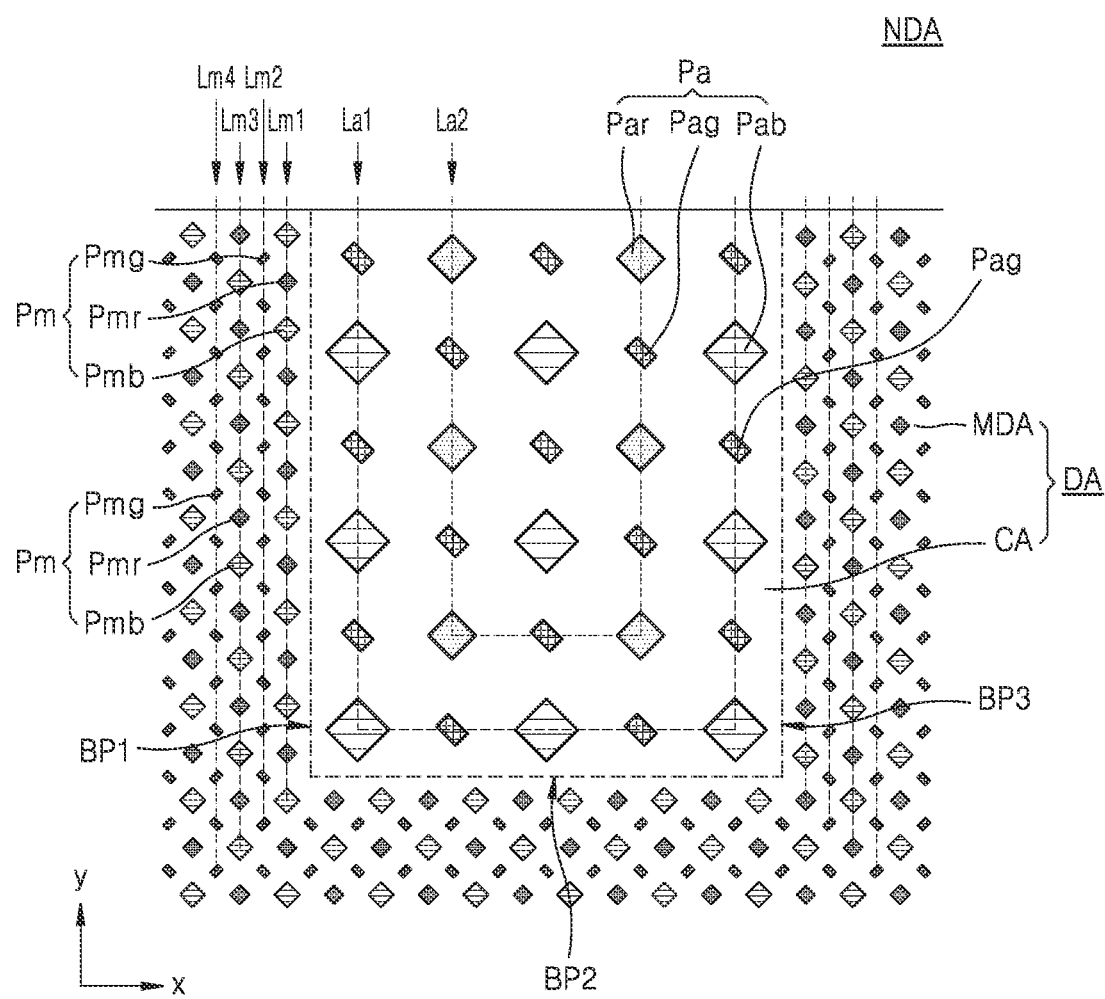

FIGS. 12A and 12B are plan views schematically illustrating a pixel arrangement structure according to an embodiment, and FIGS. 13A and 13B are plan views schematically illustrating a pixel arrangement structure according to an embodiment.

An arrangement of the auxiliary sub-pixels Pa of the component area CA of FIGS. 12A to 13B is different from the arrangement of the auxiliary sub-pixels Pa of the component area CA of FIGS. 10A and 11B described above.

In FIGS. 12A, 12B, 13A, and 13B, the auxiliary sub-pixels Pa arranged according to a preset rule may be arranged in the component area CA. The auxiliary sub-pixels Pa arranged in the component area CA may be evenly arranged to form a matrix. In other words, the auxiliary sub-pixels Pa are arranged to form a lattice arrangement, and display elements emitting two different colors from each other may be alternately arranged in a same row or column.

In FIGS. 12A and 12B, the main sub-pixels Pm in the main display area MDA have a same arrangement, but there is a difference in arrangement between the auxiliary sub-pixels Pa in the component area CA. The green main sub-pixel Pmg is arranged on the first main line Lm1 arranged along an innermost portion of the main display area MDA of FIGS. 12A and 12B. The main display area MDA of FIGS. 12A and 12B is same as the main display area MDA of FIGS. 10A and 10B described above, and redundant descriptions thereof will be omitted.

Referring to the component area CA of FIG. 12A, the auxiliary sub-pixels Pa may be defined as the first auxiliary line La1 and the second auxiliary line La2 in an order of arrangement from the outermost portion of the component area CA. The auxiliary sub-pixels Pa arranged in an inner direction of the second auxiliary line La2, that is, a direction toward a central portion of the component area CA, may be in a form in which an arrangement of the auxiliary sub-pixels Pa of the first auxiliary line La1 and the second auxiliary line La2 is repeated.

In an embodiment, the green auxiliary sub-pixel Pag and the red auxiliary sub-pixel Par may be alternately arranged on the first auxiliary line La1, which is the outermost line of the component area CA. In other words, the auxiliary sub-pixels Pa closest to the main display area MDA may be green and red. The green auxiliary sub-pixel Pag and the blue auxiliary sub-pixel Pab may be alternately arranged on the second auxiliary line La2 adjacent to the first auxiliary line La1. In this case, the green auxiliary sub-pixels Pag may be continuously arranged on a same row in the x direction. In other words, in a same row, the green auxiliary sub-pixels Pag may be alternately arranged with the red auxiliary sub-pixels Par or may be alternately arranged with the blue auxiliary sub-pixels Pab.

Meanwhile, referring to the component area CA of FIG. 12B, the green auxiliary sub-pixel Pag and the blue auxiliary sub-pixel Pab may be alternately arranged on the first auxiliary line La1, which is the outermost line of the component area CA. In other words, the auxiliary sub-pixels Pa closest to the main display area MDA may be green and blue. The green auxiliary sub-pixel Pag and the red auxiliary sub-pixel Par may be alternately arranged on the second auxiliary line La2 adjacent to the first auxiliary line La1. In this case, as described above, the green auxiliary sub-pixels Pag are not continuously arranged in a same row in the x direction.

In FIG. 12A, the green auxiliary sub-pixel Pag and the blue auxiliary sub-pixel Pab are alternately arranged in a first row of the component area CA closest to the peripheral area NDA, and in FIG. 12B, the green auxiliary sub-pixel Pag and the red auxiliary sub-pixel Par are alternately arranged in a first row of the component area CA closest to the peripheral area NDA. However, the present disclosure is not limited thereto. The embodiment described above may be modified according to whether a display element from which the first auxiliary line La1 starts (e.g., an uppermost left end) is the red auxiliary sub-pixel Par, the green auxiliary sub-pixel Pag, or the blue auxiliary sub-pixel Pab.

In FIGS. 13A and 13B, the main sub-pixels Pm in the main display area MDA have a same arrangement, but there is a difference in arrangement between the auxiliary sub-pixels Pa in the component area CA. The red main sub-pixel Pmr and the blue main sub-pixel Pmb are alternately arranged on the first main line Lm1 arranged along the innermost portion of the main display area MDA of FIGS. 13A and 13B. The main display area MDA of FIGS. 13A and 13B is same as the main display area MDA of FIGS. 11A and 11B described above, and redundant descriptions thereof will be omitted.

Referring to the component area CA of FIG. 13A, the green auxiliary sub-pixel Pag and the red auxiliary sub-pixel Par may be alternately arranged on the first auxiliary line La1 that is the outermost line of the component area CA. In other words, the auxiliary sub-pixels Pa closest to the main display area MDA may be green and red. The green auxiliary sub-pixel Pag and the blue auxiliary sub-pixel Pab may be alternately arranged on the second auxiliary line La2 adjacent to the first auxiliary line La1.

In other words, in FIG. 13A, at each of the boundary portions BP, the red and blue main sub-pixels Pmr and Pmb may be alternately arranged at the innermost portion of the main display area MDA, and the red and green auxiliary sub-pixels Par and Pag may be alternately arranged at the outermost portion of the component area CA.

Meanwhile, referring to the component area CA of FIG. 13B, the green auxiliary sub-pixel Pag and the blue auxiliary sub-pixel Pab may be alternately arranged on the first auxiliary line La1 that is the outermost line of the component area CA. In other words, the auxiliary sub-pixels Pa closest to the main display area MDA may be green and blue. The green auxiliary sub-pixel Pag and the red auxiliary sub-pixel Par may be alternately arranged on the second auxiliary line La2 adjacent to the first auxiliary line La1. In this case, as described above, the green auxiliary sub-pixels Pag are not continuously arranged in a same row in the x direction.

In other words, in FIG. 13B, at each of the boundary portions BP, the red and blue main sub-pixels Pmr and Pmb may be alternately arranged at the innermost portion of the main display area MDA, and the green and blue auxiliary sub-pixels Pag and Pab may be alternately arranged at the outermost portion of the component area CA.

As described above with reference to FIGS. 11A to 13B, the main sub-pixel Pm arranged at the innermost portion of the main display area MDA of the display area DA and the auxiliary sub-pixel Pa arranged at the outermost portion of the component area CA of the display area DA may have a mutually identical arrangement to correspond to each of the boundary portions where the main display area MDA and the component area CA meet. For example, as shown in FIG. 12A, when the green main sub-pixels Pmg and Pmg' are continuously arranged at the innermost portion of the main display area MDA and the green and red auxiliary sub-pixels Pag and Par are alternately arranged at the outermost portion of the component area CA to correspond to the first boundary portion BP1, the second boundary portion BP2 and the third boundary portion BP3 may have a same pixel arrangement (i.e., the same display element arrangement) as the first boundary portion BP1. Through the pixel arrangement (i.e., the display element arrangement) described above, a difference of visibility between the boundary portions BP may be minimized.

FIG. 14 is a plan view schematically illustrating a pixel arrangement structure according to an embodiment.

In FIG. 14, the main display area MDA and the component area CA contact each other at four surfaces. In other words, the component area CA of FIG. 14 is approximately quadrilateral and may be in a form in which four surfaces of the quadrilateral are surrounded by the main display area MDA. The component area CA may be located in the main display area MDA.

The display elements (for example, the main sub-pixel Pm and the auxiliary sub-pixel Pa) located to correspond to each of the boundary portions BP (for example, the first boundary portion BP1, the second boundary portion BP2, the third boundary portion BP3, and the fourth boundary portion BP4) where the main display area MDA and the component area CA meet may have a same arrangement as each other. In other words, the main sub-pixel Pm arranged at the innermost portion of the main display area MDA and the auxiliary sub-pixel arranged at the outermost portion of the component area CA may have a mutually identical arrangement to correspond to each of the boundary portions BP.

An arrangement of the main display area MDA and the auxiliary sub-pixel Pa of FIG. 14 is same as that of FIG. 12A described above, except that, in FIG. 14, the main display area MDA and the component area CA contact each other at four surfaces. Of course, the pixel arrangement (i.e., the display element arrangement) of FIGS. 12B, 13A, and 13B as well as that of FIG. 12A may be applied to FIG. 14.

FIG. 15 is a plan view schematically illustrating a pixel arrangement structure according to an embodiment.

In FIG. 15, the main display area MDA and the component area CA are in contact with each other at eight surfaces. In other words, the component area CA of FIG. 15 is approximately octagonal and may be in a form in which eight surfaces of the octagon are surrounded by the main display area MDA. The component area CA may be located in the main display area MDA.

In another embodiment, when the component area CA is an octagon as shown in FIG. 15, at least one surface thereof may contact the peripheral area NDA. In FIG. 15, the fourth boundary portion BP4 located at an upper side of the component area CA may be in contact with the peripheral area NDA.

Referring to FIG. 15, from among the boundary portions BP where the main display area MDA and the component area CA meet, display elements (for example, the main sub-pixel Pm and the auxiliary sub-pixel Pa) located to correspond to the first boundary portion BP1 to the fourth boundary portion BP4 in the first direction (e.g., y-direction) or the second direction (e.g., x-direction) may have a same arrangement as each other. In addition, from among the boundary portions BP where the main display area MDA and the component area CA meet, display elements (for example, the main sub-pixel Pm and the auxiliary sub-pixel Pa) located to correspond to the fifth boundary portion BP5 to the eighth boundary portion BP8 in diagonal directions (e.g., w1-direction and w2-direction) may have a same arrangement as each other. In this case, a pixel arrangement (i.e., a display element arrangement) corresponding to the first boundary portion BP1 to the fourth boundary portion BP4 in the first direction (e.g., the y direction) or the second direction (e.g., the x direction) may be different from a pixel arrangement (i.e., a display element arrangement) corresponding to the fifth boundary portion BP5 to the eighth boundary portion BP8 in the diagonal directions (e.g., w1-direction and w2-direction).

In an embodiment, to respectively correspond to the first boundary portion BP1 to the fourth boundary portion BP4, the green main sub-pixel Pmg may be continuously arranged on the first main line Lm1 located at the innermost portion of the main display area MDA, the red main sub-pixel Pmr and the blue main sub-pixel Pmb may be continuously arranged on the second main line Lm2 adjacent to the first main line Lm1, the green auxiliary sub-pixel Pag and the red auxiliary sub-pixel Par may be alternately arranged on the first auxiliary line La1 located at the outer portion of the component area CA, and the green auxiliary sub-pixel Pag and the blue auxiliary sub-pixel Pab may be alternately arranged on the second auxiliary line La2 adjacent to the first auxiliary line La1.

Meanwhile, to respectively correspond to the fifth boundary portion BP5 to the eighth boundary portion BP8, green main sub-pixel Pmg and the red main sub-pixel Pmr may be alternately arranged on the first main line Lm1 located at the innermost portion of the main display area MDA, the green main sub-pixel Pmg and the blue main sub-pixel Pmb may be continuously arranged on the second main line Lm2 adjacent to the first main line Lm1, the green auxiliary sub-pixel Pag may be continuously arranged on the first auxiliary line La1 located at the outermost portion of the first auxiliary line La1, and the red auxiliary sub-pixel Par and the blue auxiliary sub-pixel Pab may be alternately arranged on the second auxiliary line La2 adjacent to the first auxiliary line La1.

As described above, in the embodiment of FIG. 15, a same pixel arrangement (i.e., a same display element arrangement) is provided to correspond to the boundary portions BP extending in directions orthogonal to each other, and thus, a symmetrical pixel arrangement (i.e., a symmetrical display element arrangement) may be provided in the component area CA and an outer area thereof. Through this pixel arrangement (i.e., a display element arrangement), a difference of visibility between the boundary portions BP may be minimized.

FIG. 16 is a plan view schematically illustrating a pixel arrangement structure according to an embodiment.

The embodiment of FIG. 16 is similar to that of FIG. 13A or 13B described above, except an arrangement of the auxiliary sub-pixels Pa in the component area CA.

The red main sub-pixel Pmr and the blue main sub-pixel Pmb are alternately arranged on the first main line Lm1 arranged along the innermost portion of the main display area MDA of FIG. 16. The main display area MDA of FIG. 16 is same as the main display area MDA of FIGS. 11A and 11B or the main display area MDA of FIGS. 13A and 13B, and thus, redundant descriptions thereof will be omitted.

Referring to the component area CA, the auxiliary sub-pixels Pa have an arrangement approximately similar to an arrangement of the main sub-pixels Pm. In other words, the auxiliary sub-pixels Pa may be arranged in a pentile structure. In more detail, the blue auxiliary sub-pixel Pab and the red auxiliary sub-pixel Par alternate along a same row or column, and are formed in a matrix form, and the green auxiliary sub-pixel Pag may be continuously arranged along a same row or column between these sub-pixels. Accordingly, when the number of auxiliary sub-pixels Pa arranged in an n-th row in the component area CA is m, the number of auxiliary sub-pixels Pa arranged in a $(n+1)^{th}$ row may be m+1. In this case, a row in which the green auxiliary sub-pixel Pag is arranged may be the $(n+1)^{th}$ row.

Referring to the component area CA of FIG. 16, the green auxiliary sub-pixel Pag is continuously arranged on the first auxiliary line La1 that is the outermost line of the component area CA. In other words, the auxiliary sub-pixel Pa closest to the main display area MDA may be green. The red auxiliary sub-pixel Par and the blue auxiliary sub-pixel Pab may be alternately arranged on the second auxiliary line La2 adjacent to the first auxiliary line La1.

In other words, in FIG. 16, at each of the boundary portions BP, the red and blue main sub-pixels Pmr and Pmb may be alternately arranged at the innermost portion of the main display area MDA, and the green auxiliary sub-pixel Pag may be continuously arranged at the outermost portion of the component area CA.

As described above, in the embodiment of FIG. 16, a same pixel arrangement (i.e., a same display element arrangement) is provided to correspond to the boundary portions BP extending in directions orthogonal to each other, and thus, a symmetrical pixel arrangement (i.e., a symmetrical display element arrangement) may be provided in the component area CA and an outer area thereof. Through the pixel arrangement (i.e., the display element arrangement) described above, a difference of visibility between the boundary portions BP may be minimized.

Although the display apparatus has been mainly described, the present disclosure is not limited thereto. For example, a method of manufacturing a display apparatus by using the above-described display apparatus also falls within the scope of the present disclosure.

According to an embodiment configured as described above, a display apparatus that provides a high-quality image with improved quality of an image output through a component. However, the scope of the present disclosure is not limited by this effect.

It should be understood that the embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure including the following claims.

What is claimed is:

1. A display apparatus having a main display area, a component area, and a peripheral area, the display apparatus comprising:
   a substrate;
   a plurality of main sub-pixels including main display elements disposed on the substrate to correspond to the main display area; and
   a plurality of auxiliary sub-pixels including auxiliary display elements disposed on the substrate to correspond to the component area,
   wherein the main display area and the component area have boundary portions where an innermost portion of the main display area meets an outermost portion of the component area, and the boundary portions comprise a first boundary portion, a second boundary portion, and a third boundary portion,
   wherein the plurality of main sub-pixels arranged at the innermost portion of the main display area corresponding to the first boundary portion, the second boundary portion and the third boundary portion include a first arrangement of colored main sub-pixels, and
   wherein the plurality of auxiliary sub-pixels arranged at the outermost portion of the component area corresponding to the first boundary portion, the second boundary portion and the third boundary portion include a second arrangement of colored auxiliary sub-pixels.

2. The display apparatus of claim 1, wherein the first boundary portion and the third boundary portion are arranged in a first direction, and the second boundary portion is arranged in a second direction crossing the first direction.

3. The display apparatus of claim 2, wherein one end of the first boundary portion is connected to one end of the second boundary portion and an other end of the second boundary portion is connected to one end of the third boundary.

4. The display apparatus of claim 1, wherein at least one edge of the component area is in direct contact with the peripheral area.

5. The display apparatus of claim 1, wherein the plurality of auxiliary sub-pixels corresponding to the component area include a plurality of first-color auxiliary sub-pixels, a plurality of second-color auxiliary sub-pixels, and a plurality of third-color auxiliary sub-pixels, and
   the plurality of first-color auxiliary sub-pixels, the plurality of second-color auxiliary sub-pixels, and the plurality of third-color auxiliary sub-pixels are arranged in a diagonal direction with respect to the first boundary portion.

6. The display apparatus of claim 5, wherein main sub-pixels arranged on a part of the main display area that is closest to the boundary portions are green.

7. The display apparatus of claim 6, wherein auxiliary sub-pixels on a first line located at a portion of the component area that is closest to the boundary portions are either red or blue.

8. The display apparatus of claim 7, wherein auxiliary sub-pixels that are arranged on a second line neighboring the first line in the component area are green.

9. The display apparatus of claim 5, wherein red main sub-pixels and blue main sub-pixels are alternately arranged on a portion of the main display area that is closest to the boundary portions.

10. The display apparatus of claim 9, wherein auxiliary sub-pixels that are arranged on a portion of the component area that is closest to the boundary portions are green.

11. The display apparatus of claim 1, wherein the plurality of auxiliary sub-pixels includes a plurality of first-color auxiliary sub-pixels, a plurality of second-color auxiliary sub-pixels, and a plurality of third-color auxiliary sub-pixels, and
   either the plurality of first-color auxiliary sub-pixels and the plurality of second-color auxiliary sub-pixels, or the plurality of first-color auxiliary sub-pixels and the plurality of third-color auxiliary sub-pixels are alternatively arranged in a line.

12. The display apparatus of claim 11, wherein green main sub-pixels are arranged on an innermost line of the main display area closest to the boundary portions.

13. The display apparatus of claim 12, wherein red auxiliary sub-pixels and green auxiliary sub-pixels are alternately arranged on a first line located at the outermost portion of the component area closest to the boundary portions.

14. The display apparatus of claim 12, wherein blue auxiliary sub-pixels and green auxiliary sub-pixels are alternately arranged on a first line located at the outermost portion of the component area closest to the boundary portions.

15. The display apparatus of claim 11, wherein red main sub-pixels and blue main sub-pixels are alternately arranged on an innermost line of the main display area closest to the boundary portions.

16. The display apparatus of claim 15, wherein red auxiliary sub-pixels and green auxiliary sub-pixels are alternately arranged at an outermost line of the component area closest to the boundary portions.

17. The display apparatus of claim 15, wherein blue auxiliary sub-pixels and green auxiliary sub-pixels are alternately arranged at an outermost line of the component area closest to the boundary portions.

18. The display apparatus of claim 1, wherein red main sub-pixels and blue main sub-pixels are alternately arranged on an innermost line of the main display area closest to the boundary portions,
   green auxiliary sub-pixels are arranged on a first line located at the outermost portion of the component area closest to the boundary portions, and
   red auxiliary sub-pixels and blue auxiliary sub-pixels are alternately arranged on a second line neighboring the first line of the component area in the component area.

19. The display apparatus of claim 1, wherein the boundary portions further comprise a fourth boundary portion arranged in a diagonal direction with respect to the first boundary portion, the second boundary portion, and the third boundary portion, and
   arrangements of the main sub-pixels and the auxiliary sub-pixels in lines that extend parallel to the first boundary portion, the second boundary portion, and the third boundary portion are different from an arrangement of the main sub-pixels and the auxiliary sub-pixels in a line that extends parallel to the fourth boundary portion.

20. The display apparatus of claim 1, wherein the plurality of auxiliary sub-pixels is provided in the component area and are spaced apart from each other, and
   the component area includes a transmission area disposed between the plurality of auxiliary sub-pixels.

21. The display apparatus of claim 20, further comprising:
a main pixel circuit arranged on the substrate to correspond to the main display area, and connected to the main sub-pixel; and
an auxiliary pixel circuit arranged on the substrate to correspond to the peripheral area, and connected to the auxiliary sub-pixel.

22. The display apparatus of claim 1, further comprising a component arranged under the substrate to correspond to the component area.

23. The display apparatus of claim 22, wherein the component includes a camera.

* * * * *